US008539321B2

(12) United States Patent
Kern et al.

(10) Patent No.: US 8,539,321 B2
(45) Date of Patent: Sep. 17, 2013

(54) APPARATUS AND METHOD FOR CORRECTING AT LEAST ONE BIT ERROR WITHIN A CODED BIT SEQUENCE

(75) Inventors: Thomas Kern, Munich (DE); Ulrich Backhausen, Taufkirchen (DE); Michael Goessel, Mahlow (DE); Thomas Rabenalt, Unterhaching (DE); Stéphane Lacouture, Munich (DE)

(73) Assignee: Infineon Technologies AG, Neubiberg (DE)

( * ) Notice: Subject to any disclaimer, the term of this patent is extended or adjusted under 35 U.S.C. 154(b) by 464 days.

(21) Appl. No.: 12/943,520

(22) Filed: Nov. 10, 2010

(65) Prior Publication Data

US 2012/0117448 A1 May 10, 2012

(51) Int. Cl.
*H04M 13/00* (2006.01)
(52) U.S. Cl.
USPC .......................................... 714/785; 714/781
(58) Field of Classification Search
None
See application file for complete search history.

(56) References Cited

U.S. PATENT DOCUMENTS

| 3,623,155 | A | * | 11/1971 | Hsiao et al. | 714/785 |
|---|---|---|---|---|---|
| 3,714,629 | A | | 1/1973 | Hong et al. | |
| 5,657,331 | A | * | 8/1997 | Metzner et al. | 714/762 |
| 7,721,177 | B2 | * | 5/2010 | Gammel et al. | 714/752 |
| 7,849,388 | B2 | * | 12/2010 | Esumi et al. | 714/800 |
| 8,230,292 | B2 | * | 7/2012 | Fujiwara et al. | 714/752 |
| 2003/0023930 | A1 | * | 1/2003 | Fujiwara et al. | 714/788 |
| 2006/0282756 | A1 | * | 12/2006 | Gammel et al. | 714/801 |
| 2007/0110188 | A1 | * | 5/2007 | Esumi et al. | 375/324 |
| 2007/0162821 | A1 | * | 7/2007 | Hwang et al. | 714/758 |
| 2009/0049369 | A1 | | 2/2009 | Goessel et al. | |
| 2009/0106633 | A1 | * | 4/2009 | Fujiwara et al. | 714/785 |
| 2009/0228758 | A1 | * | 9/2009 | Choi et al. | 714/752 |
| 2011/0119559 | A1 | * | 5/2011 | Kamoshida | 714/758 |
| 2012/0117431 | A1 | * | 5/2012 | Bremler-Barr et al. | 714/718 |

OTHER PUBLICATIONS

Anfinson et al., "A Linear Algebraic Model of Algorithm-Based Fault Tolerance", 1988, IEEE.*
Chen et al., "Error-Correcting Codes for Semiconductor Memory Applications: A State-of-the-Art Review", Mar. 1984, IBM j> Res. Develop, vol. 28, No. 2.*
Hsiao, M. Y., "A Class of Optimal Minimum Odd-weight-column SEC-DED Codes", Jul. 1970, IBM Journal of Research and Development, vol. 14, Iss. 4, pp. 395-401.*

* cited by examiner

*Primary Examiner* — Gabriel Chu
(74) *Attorney, Agent, or Firm* — Eschweiler & Associates, LLC

(57) ABSTRACT

An apparatus for correcting at least one bit error within a coded bit sequence includes an error syndrome generator and a bit error corrector. The error syndrome generator determines the error syndrome of a coded bit sequence derived by a multiplication of a check matrix with a coded bit sequence.

22 Claims, 14 Drawing Sheets

(A)　　　(B)　　　(C)　　　(D)

(E)

(F)　　　(G)　　　(H)　　　(I)

1600

Determining an error syndrome of a coded bit sequence derivable by a multiplication of a check matrix (H) with the coded bit sequence.

1610

Correcting a bit error within the coded bit sequence based on the determined error syndrome of the coded bit sequence.

APPARATUS AND METHOD FOR CORRECTING AT LEAST ONE BIT ERROR WITHIN A CODED BIT SEQUENCE

FIELD

Embodiments according to the invention relate to error correction and error detection of digital signals and particularly to an apparatus and a method for correcting at least one bit error within a coded bit sequence.

BACKGROUND

Due to the high integration density of electronic circuits and storages, the frequency of errors increases.

Apart from 1-Bit-errors, increasingly also 2-Bit-errors and general multi-bit errors are to be considered, i.e. to be corrected and to be detected. In particular, in error correction it is important to correct the occurred errors quickly, if possible within the current clock cycle in order to prevent a delayed processing of the corrected data as compared to the uncorrected data.

Frequently, data are written into a storage under an address and read out after some time. Here it is possible that the data when read out of the storage are faulty or corrupt and have to be corrected after reading it out.

Here, both one bit errors, two bit errors and generally multi-bit errors occur, which are caused randomly with decreasing probability, and also errors occur in which all memory cells take on the value 0 erroneously, which is to be referred to as "All-0", and also errors where all memory cells take on the value 1, to be referred to here as "All-1".

It is also of special interest to detect possible address errors with a high probability, as a faulty address for example when reading out of a storage, may lead to completely different data. It is possible to correct one bit errors by Hamming code or Hsia-codes and 2-Bit-errors relatively fast by BCH-Codes implemented in parallel.

Disadvantageous with prior solutions for 1-bit and 2-bit error correction is, for example, that the errors "All-0" and "All-1" are not part of error detection. Generally, it is of high interest to improve the reliability of error correction and error detection concepts.

SUMMARY

An embodiment of the invention provides an apparatus for correcting at least one bit error within a coded bit sequence. The apparatus comprises an error syndrome generator and a bit error corrector. The error syndrome generator is configured to determine an error syndrome of a coded bit sequence derived by a multiplication of a check matrix with the coded bit sequence. The check matrix comprises a first sub-matrix, a second sub-matrix and a third sub-matrix. Each sub-matrix comprises a plurality of lines, wherein each line comprises a plurality of binary components. Further, at least a first predefined component or a second predefined component of each line of the first sub-matrix comprises a first bit value. The second sub-matrix comprises lines being linearly independent from each other and the first predefined component and the second predefined component of each line of the second sub-matrix comprises a same second bit value. The third sub-matrix comprises lines being linearly independent from each other and the first predefined component or the second predefined component of each line of the third sub-matrix comprises the first bit value. Further, either an XOR-sum of the first predefined components of all lines of the first sub-matrix and the third sub-matrix is equal to the second bit value and an XOR-sum of the second predefined components of all lines of the first sub-matrix and the third sub-matrix is equal to the second bit value, if the first bit value is equal to 1, or an XNOR-sum of the first predefined components of all lines of the first sub-matrix and the third sub-matrix is equal to the second bit value and an XNOR-sum of the second predefined components of all lines of the first sub-matrix and the third sub-matrix is equal to the second bit value, if the first bit value is equal to 0. Additionally, a result of a multiplication of the check matrix and a test vector is equal to a result of a multiplication of the second sub-matrix and a resulting vector, wherein at least one component of the resulting vector comprises the second bit value. Further, the bit error corrector is configured to correct a bit error within the coded bit sequence based on the determined error syndrome of the coded bit sequence.

By using an error syndrome determined according to a check matrix with properties described above, the error correction and error detection abilities of the proposed concept may be significantly better than with known concepts. For example, the proposed concept enables one to differentiate every 1-bit error from All-1-errors or All-0-errors. Thus, it may not be the case that a word, which is read out of a storage, in case of a correctable 1-bit error is mixed up with an All-0-error or an All-1-error.

BRIEF DESCRIPTION OF THE DRAWINGS

Embodiments according to the invention will be detailed subsequently referring to the appended drawings, in which:

FIG. 16 is a flowchart of a method for correcting at least one bit error within a coded bit sequence.

DETAILED DESCRIPTION

Figure 1:
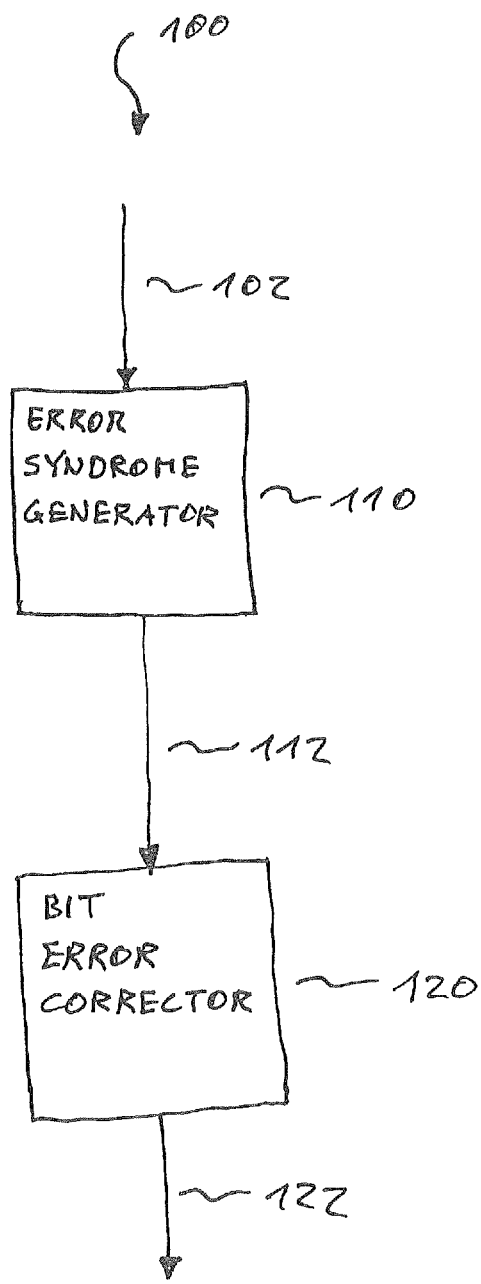
FIG. 1 is a block diagram of an apparatus for correcting at least one bit error within a coded bit sequence.

In the following, the same reference numerals are partly used for objects and functional units having the same or similar functional properties and the description thereof with regard to a figure shall apply also to other figures in order to reduce redundancy in the description of the embodiments.

Before the proposed concept is described in greater detail, some theoretical basics and basic terms on linear block codes, in particular Hamming codes, Hsiao codes and BCH-codes are briefly presented. For example, these are also described in "Fujiwara, E., Code Design for Dependable Systems, Wiley, 2006, p. 49-53, p. 98-101 and in Tzschach, H. and Haflinger, G., Codes für den störungsgesicherten Datentransfer, Oldenburg Verlag, 1993, p. 111-121".

A Hamming code is a linear block code with a code distance 3. If m is the number of check bits, its length is $n=2^m-1$. The number of data bits is $k=2^m-1-m$. As any linear code, the Hamming code may as usual be described by a generator matrix G, briefly G-matrix, and a check matrix H (also called parity-check matrix), briefly H matrix. The check matrix of a unshortened Hamming code is an (m,n) matrix whose columns are any possible different $2^m-1$ binary vectors unequal to 0. These columns are also described as m-digit binary numbers, and the following applies $$H=(h_1,\ldots h_{2^m-1})=(1_{bin}, 2_{bin},\ldots,[2^m-1]_{bin}),$$

wherein $i_{bin}$ designates the representation of i as an m-digit binary member.

A Hamming code may be shortened, as any other linear block code by eliminating a certain number of columns in the check matrix of the unshortened code. Apart from that, columns may also be exchanged in thus the check matrix may be transformed.

From the check matrix of a linear code a generator matrix may be determined, briefly called G matrix. The generator matrix is a (k,n) matrix. If k information bits $u_1, \ldots, u_k$ are present, the same are coded by the generator matrix into a code word v $$v(v_1,\ldots,v_n)u\cdot G=(u_1,\ldots,u_k)\cdot G$$

If a word $v'=v_1,\ldots v_n$ is checked whether it is a code word, a syndrome S is formed, with $$S=H\cdot v'^T$$

with $S=S_1,\ldots,S_m$. If $S=0$, no error is detected. If $S=h_i$, a 1-bit error is present in the i-th bit of v'.

The error correction of the bits $v'_1,\ldots,v'_n$ may be done by correction circuits $K_1,\ldots,K_n$ which determine a correction value $\Delta v_1$ from the error syndrome S, which is XORed (linked by a logical XOR function) with $v'_i$. For $i=1,\ldots,n$ in case of a 1-bit error the correction circuit outputs a value 1, if $S=h_i$. If the error syndrome is equal to 0, the correction circuit outputs the value 0.

A Hsiao-code is a linear code with a code distance of 4. If the Hsiao-code has m check bits, its check matrix H consists of all m-digit binary vectors comprising an odd number of ones. The length of an (unshortened) Hsiao-code with m check bits is $n=2^{m-1}$, as there are $2^{m-1}$ different m-digit binary vectors having an odd number of ones. By deleting columns and by reordering columns of the unshortened Hsiao-code, a check matrix of a shortened Hsiao-code is obtained. Testing a word $v'=v_1,\ldots,v_{n'}$ is again done by checking the error syndrome $$S=H\cdot v'^T$$

If $S=h_j$, i.e. equal to the j-th column of the check matrix, a 1-bit error is corrected in the j-th bit, by XOR-ing (applying a logical XOR-function) a correction value $\Delta v_g=1$ with $v'_j$. This correction value $\Delta v_j$ may be determined from the error syndrome S by a correction circuit $K_j$. The correction circuit $K_j$ then outputs a value 1, if $S=h_j$. If S is a binary vector with an even number of ones, an incorrectable error is indicated.

As the application of the proposed concept to BCH-codes (Bose-Chaudhuri-Hocquenghem-Codes) is also of special interest, some characteristics of BCH-codes are to be described. For example, they are also described in "Tzschach, H. and Haßlinger, G.: Codes für den störungssicheren Datentransfer, Oldenburg Verlag 1993, p. 111-121" and "Lin, S., Costello, D.: Error Control Coding, Prentice Hall, 1983, chapter 6".

A BCH-code is a special cyclic code and thus a linear code. A BCH-code may be described as a cyclic code by a special generator polynomial G(z) and as a linear code by a generator matrix G and by a check matrix H.

In case of a 2-bit error correcting BCH-code, the generator polynomial may in its simplest form be represented as $$G(z)=(z)=m_\alpha(z)\cdot m_{\alpha^3}(z) \tag{1}$$

Here, $m_\alpha(z)$ is a primitive polynomial also serving as a modular polynomial of the considered Galois field, $\alpha$ is a primitive element of the Galois field and root of the polynomial. The polynomial $m_{\alpha_3}(z)$ is the minimum polynomial of the root $\alpha^3$. The associated Galois field is designated by $GF(2^M)$. The length of the unshortened BCH code is then $2^M-1$. If the overall parity is considered, G(z) may be represented in the following form.

$$G(z)=m_\alpha(z)\cdot m_{\alpha^3}(z)\cdot(z+1) \tag{2}$$

Without integrating the overall parity, the check matrix may be represented in its separated form as $$H_{BCH}^{sep} = \begin{pmatrix} \alpha^{2^m-k} & \ldots & \alpha^i & \ldots & \alpha^1 & \alpha^0 \\ \alpha^{3\cdot(2^m-k)} & \ldots & \alpha^{3\cdot i} & \ldots & \alpha^{3\cdot 1} & \alpha^0 \end{pmatrix} = \begin{pmatrix} H_1 \\ H_3 \end{pmatrix}$$

wherein $\alpha$ is a primitive element of the Galois field $GF(2^M)$ and the exponents of $\alpha$ are each to be interpreted modulo $2^M-1$. The parity may be included in the error detection by selecting the check matrix as $$H_{BCH}^{sep} = \begin{pmatrix} \alpha^{2^m-k} & \ldots & \alpha^i & \ldots & \alpha^1 & \alpha^0 \\ \alpha^{3\cdot(2^m-k)} & \ldots & \alpha^{3\cdot i} & \ldots & \alpha^{3\cdot 1} & \alpha^0 \\ 1 & \ldots & 1 & \ldots & 1 & 1 \end{pmatrix} = \begin{pmatrix} H_1 \\ H_3 \\ P \end{pmatrix} \tag{4}$$

wherein in the last row there are only ones.

A 1-bit error in the i-th bit position is described as [i], an L-bit error in the positions $i_1, i_2, \ldots, i_l$ as $[i_1, i_2, \ldots, i_L]$. To each error $[i_l, \ldots, i_L]$ an n-component error vector $e(i_1, \ldots, i_L)=(e_0, \ldots, e_{n-1})$ is associated, wherein $$e_i = \begin{cases} 1 & \text{for } i \in \{i_1, \ldots, i_L\} L \geq 0 \\ 0 & \text{else} \end{cases}$$

The component $e_j$ of the error vector $e[i_1, \ldots, i_L]$ is equal to 1 exactly when the corresponding j-th bit is faulty.

To an error $[i_l, \ldots, i_L]$ with the error vector $e=e[i_l, \ldots, i_L]$ an error syndrome $$S = H_{BCH}^{sep} \cdot e = \begin{pmatrix} H_1 \\ H_3 \end{pmatrix} \cdot e = \begin{pmatrix} s_1 \\ s_3 \end{pmatrix}$$

with $$s_1 = H_1 \cdot e \text{ und } s_3 = H_3 \cdot e$$

is associated.

By deleting columns and by reordering columns of the check matrix $H_{BCH}^{sep}$, a shortened BCH-code is obtained which is adapted to a required word width.

If the parity is not considered, the code distance is 5 and if the parity is considered, the code distance is 6. Then, 1-bit errors and 2-bit errors may be corrected using the syndrome. The syndromes of all 3-bit errors, parity included, are different from the syndromes of all 1-bit and 2-bit errors, but they may be the same among themselves.

The encoding of a BCH-code and a shortened BCH-code as a special linear code may be done with the help of a generator matrix and the decoding with the help of a check matrix. The connection between the generator polynomial and generator matrix and text matrix is, for example, described in Lin, S. and Costello, D.: Error Control Coding, Prentice-Hall, 1983, p. 92-95".

In the following, the inventive concept is described by some general and some detailed embodiments.

FIG. 1 shows a block diagram of an apparatus 100 for correcting at least one bit error within a coded bit sequence 102 according to an embodiment of the invention. The apparatus 100 comprises an error syndrome generator 110 connected to a bit error corrector 120. The error syndrome generator 110 determines an error syndrome 112 of a coded bit sequence 102 derived by a multiplication of a check matrix H with the bit sequence 102. The check matrix H comprises a first sub-matrix $H^u$, a second sub-matrix $H^a$ and a third sub-matrix $H^c$. Each sub-matrix comprises a plurality of lines and each line comprises a plurality of binary components. At least a first predefined component or a second predefined component of each line of the first sub-matrix $H^u$ comprises a first bit value (1 or 0). Further, the second sub-matrix $H^a$ comprises lines being linearly independent from each other (i.e. each line of the second sub-matrix is linearly independent from each other line of the second sub-matrix) and the first predefined component and the second predefined component of each line of the second sub-matrix $H^a$ comprises a same second bit value (0 or 1). The third sub-matrix $H^c$ comprises lines being linearly independent from each other and the first predefined component or the second predefined component of each line of the third sub-matrix $H^c$ comprises the first bit value (1 or 0). If the first bit value is equal to 1 an XOR-sum of the first predefined components of all lines of the first submatrix $H^u$ and the third submatrix $H^c$ is equal to the second bit value 0 and the XOR-sum of the second predefined components of all lines of the first submatrix $H^u$ and the third submatrix $H^c$ is equal to the second bit value 0. If the first bit value is equal to 0, an XNOR-sum of the first predefined components of all lines of the first submatrix $H^u$ and the third submatrix $H^c$ is equal to the second bit value 1 and an XNOR-sum of the second predefined components of all lines of the first submatrix $H^u$ and the third submatrix $H^c$ is equal to the second bit value 1. Additional results of a multiplication of the check matrix H and a test vector is equal to a result of a multiplication of the second sub-matrix $H^a$ and a resulting vector, wherein at least one component of the resulting vector comprises the second bit value (0 or 1). Further, the bit error corrector 120 corrects a bit error within the coded bit sequence 102 based on the determined error syndrome 112 of the coded bit sequence 102 to obtain a corrected bit sequence 122.

By using an error syndrome 112 derivable by a check matrix described above, an error correction circuit for 1-bit and 2-bit errors can be realized, which is able to detect also the errors All-0 and All-1, for example. In other words, the apparatus 100 enables to differentiate every 1-bit error from errors All-1 and All-0. Thus, for example, it may not be the case anymore that a word read out of a storage in case of a correctable 1-bit error is mixed up with an All-0 or All-1 error. The detection and/or correction of All-0 and All-1 errors is of high interest, because these failures are very common.

The first bit value and the second bit value may be logical 0 or logical 1, or a high level or a low level of a signal in the circuitry. Therefore, there are two possible cases. Either the first bit value is equal to 1 (logical 1) and the second bit value is equal to 0 (logical 0) or the first bit value is equal to 0 and the second bit value is equal to 1. Both cases represent equivalent implementations of the described concept.

This shows that the described concept can be realized using positive or negative logic. The only difference is that the XOR-sum is used, if the first bit value is equal to 1, and the XNOR-sum is used, if the first bit value is equal to 0. In this connection, an XOR-sum of the first predefined components of all lines means applying the logical XOR function (exclusive-OR-function) to the first predefined components of all lines resulting in a bit value (either 0 or 1). Consequently, the XNOR-sum of the first predefined components of all lines means applying the logical XNOR function (exclusive-not-OR-function) to the first predefined components of all lines resulting in a bit value (either 0 or 1). Same is valid for the second predefined component. This may be realized, for example, by an XOR-gate or an XNOR-gate with a number of inputs corresponding to the number of lines of the matrices.

Further, a line of a matrix may be a row or a column of a matrix. Since a matrix is easy to transpose, the inventive concept can be realized independent from whether a line of a matrix is a row or a column. Therefore, there are again two possible cases. Either each mentioned line of a matrix is a column of the respective matrix and the same components (e.g. first predefined components or second predefined components) of each line of a matrix represents a row of this matrix. Otherwise each line of a matrix is a row of the respective matrix and the same components of the lines of a matrix represent a column of this matrix.

Consequently, in connection with the described concept, of each line of the first sub-matrix, of the second sub-matrix and of the third sub-matrix is a column of the respective sub-matrix. The first predefined components of the lines of the first sub-matrix $H^u$, of the second sub-matrix $H^a$ and of the third sub-matrix $H^c$ represent a row of the check matrix H and the second predefined components of the lines of the first sub-matrix $H^u$, of the second sub-matrix $H^a$ and of the third sub-matrix Fr represent another row of the check matrix H. Alternatively, each line of the first sub-matrix $H^u$, of the second sub-matrix $H^a$ and of the third sub-matrix $H^c$ is a row of the respective sub-matrix. The first predefined components of the lines of the first sub-matrix $H^u$, of the second sub-matrix $H^a$ and the third sub-matrix $H^c$ represent a column of the check matrix H and the second predefined components of the lines of the first sub-matrix $H^u$, of the second sub-matrix $H^a$ and of the third sub-matrix $H^c$ represent another column of the check matrix H.

Each line of a matrix comprises a plurality of binary components. In other words, each component is either equal to 1 or equal to 0. In this connection, a first predefined component and a second predefined component may be actually the first and the second component of a line, but they can also be arbitrary other components (e.g. the last and the next to last component or the third component and the fifth component or another predefined component combination). However, the first predefined component of the first sub-matrix, the second sub-matrix and the third sub-matrix are the same components within the lines of the respective matrix, which is accordingly valid for the second predefined components of the lines of the first sub-matrix, the second sub-matrix and the third sub-matrix. For example, if the first predefined component is the n-th component of a line of the first sub-matrix, then the first predefined component of a line of the second sub-matrix means also the n-th component of the line. Same is valid for the third sub-matrix as well as for the whole check matrix.

The check matrix may also be called parity-check matrix.

For example, the check matrix may be represented in a separated form. Further, the check matrix may be a check matrix of a shortened Hamming code, a shortened Hsiao-code or a shortened BCH-code, for example.

The error syndrome generator 110 may determine the error syndrome 112 by multiplying the check matrix with the coded bit sequence 102. Alternatively, the error syndrome generator 110 may comprise a storage containing a look-up table. This look-up table may contain information about error syndromes corresponding to different coded bit sequences 102. In other words, the look-up table may contain for each possible coded bit sequence the corresponding error syndrome derived by a multiplication of the check matrix with the coded bit sequence 102. In this example, the error syndrome generator 110 may easily determine the error syndrome 112 by taking the stored error syndrome associated with the coded bit sequence 102.

The error syndrome generator 110, the bit error corrector 120 and/or other optional elements described later on may be independent hardware units or part of a computer or microcontroller as well as a computer program or a software product for running on a computer or microcontroller.

The error syndrome generator 110, the bit error corrector 120 and/or other optional components described later on may be implemented independent from each other or at least partly together. For this, for example, the functionality of the error syndrome generator 110, the bit error corrector 120 and/or other optional components described below may be at least partly united to a combined hardware unit or software unit by a synthesis tool.

During a multiplication of the check matrix H with the coded bit sequence 102, a first group of bits of the coded bit sequence 102 is multiplied with the first sub matrix, a second group of bits of the coded bit sequence is multiplied with the second sub-matrix and a third group of bits of the coded bit sequence is multiplied with the third sub-matrix. In other words, the error syndrome of the coded bit sequence is derived based on a multiplication of the first sub-matrix with a first group of bits of the coded bit sequence, a multiplication of the second sub-matrix with the second group of bits of the coded bit sequence and a multiplication of the third sub-matrix with a third group of bits of the coded bit sequence.

In some embodiments of the invention, the first group of bits may represent information bits, the second group of bits may represent address bits and the third group of bits may represent check bits. Therefore, the first group of bits may also be called information bits or (useful) data bits, the second group of bits may be called address bits and the third group of bits may be called check bits.

For example, the coded bit sequence or part of the coded bit sequence may be stored by an addressable storage, also called a storage unit, memory or memory unit (e.g. read only memory, random access memory or non volatile memory).

The first group of bits (data bits) may be independent from the second group of bits (address bits). Therefore, only the first group of bits and the third group of bits of the coded bit sequence may be stored at an address of the addressable storage indicated by the second group of bits. Alternatively, the coded bit sequence may also be coded by an inner code, so that at least one bit of the first group of bits depends on at least one bit of the second group of bits.

In the following, an embodiment of the invention is described in more detail. In this example, the lines of the matrices are columns, the first predefined components of the lines of the matrices represent the first row of the matrices, the second predefined components of the lines of the matrices represent the second rows of the matrices, the first bit value is equal to 1 and the second bit value is equal to 0. If the description of the detailed embodiment several additional and/or optional features can be implemented all together or one or some of them may be implemented independent from the other features described.

Figure 2:
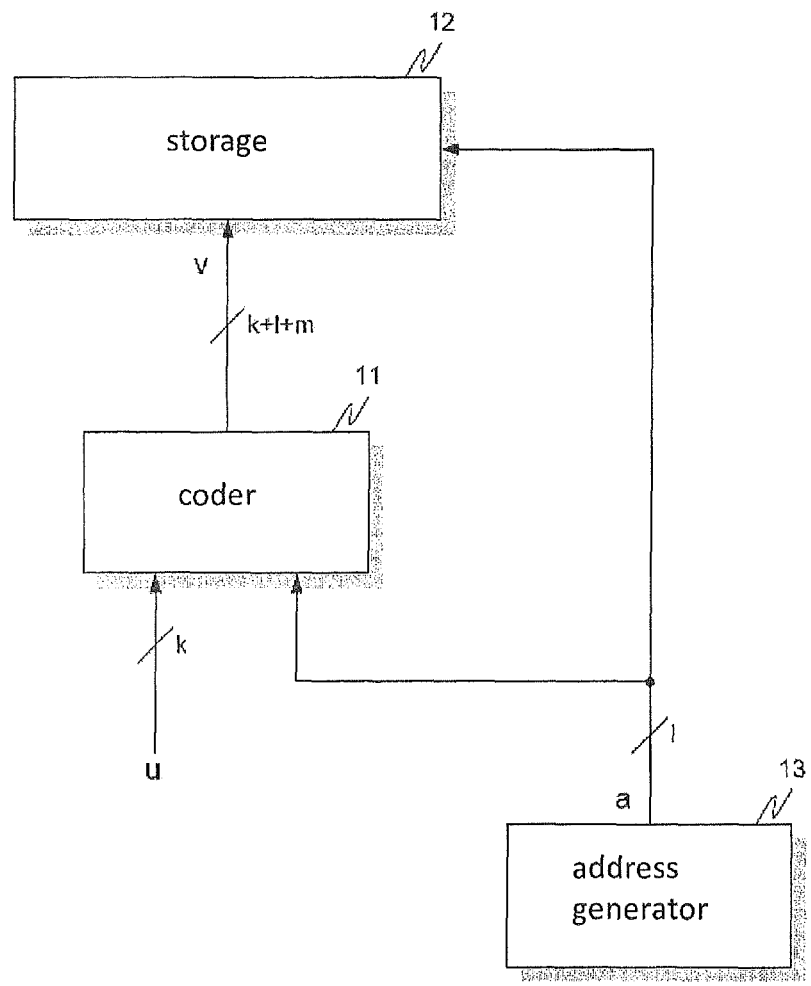
FIG. 2 is a schematic illustration of a coding under consideration of address bits.

It is illustrated in FIG. 2 how the addresses $a=a_1, \ldots a_l$ (e.g. provided by an address generator 13) are to be considered in the encoded storing of the useful data bits $u=u_1, \ldots, u_k$. At the encoder (or coder) 11 k bits wide useful data $u=u_1, \ldots, u_k$ and the l bit wide address $a=a_1, \ldots a_l$ at which the storage 12 is to be written, are applied, so that the address $\alpha$ is also applied to the address input of the storage 12. The coder 11 forms the k+l+m bit wide code word v (coded bit sequence) from the useful data u (information bits) and the address a (address bits), $$v=(u,a)\cdot G$$

In the storage 12 under the address a the code word v is stored, whose bits depend both on the useful data (information bits) and also on the address (address bits). If the generator matrix is used in its systematic form $$G=(I_{k+l}, P_{k+l,m})$$

The code word v has the form v=u, a, c and the check bits c added to the useful data bits and the address bits are designated by $$c=(u,a)\cdot P,$$

while the useful data bits u and the address bits a, are not modified in this example. $I_{k+l}$ is the (k+l) dimensional unity matrix and P is (k+l,m) matrix determining the test equations of the code.

Figure 3:
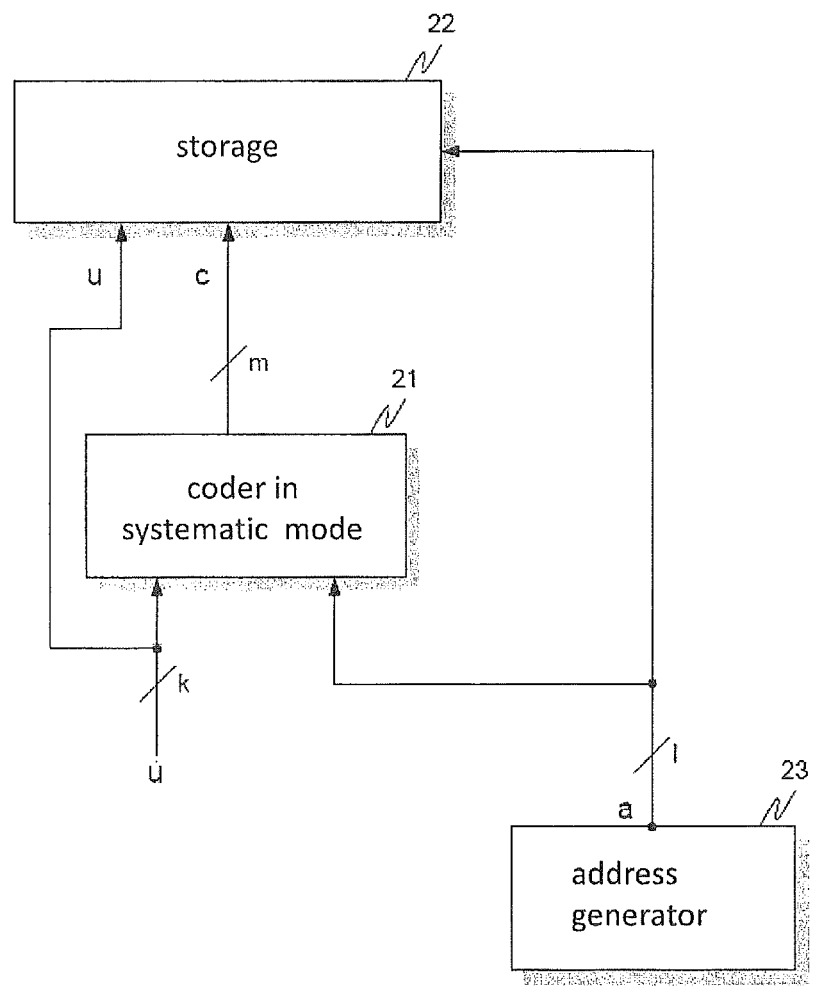
FIG. 3 is a schematic illustration of a coding for a separated H-matrix under consideration of address bits.

The encoding including the address bits for a generator matrix in the systematic form is illustrated in FIG. 3. In the storage 22 (addressable storage) only the data bits u and the check bits c are stored, while the address bits a do not have to be stored. The check bits c here both depend on the data bits u and also on the address bits a. The address bits generated by the address generator 23 are applied to the address input of the storage 22 and to the corresponding first inputs of the encoder (or coder) in a systematic form 21, while at the second k bit wide input of the coder the useful data bit u are applied, which are simultaneously also applied to the first k bits wide data input of the storage 22. The coder generates, at its m-bit wide output, the check bits c, which are applied to the second m bit wide data input of the storage 22.

Figure 4:
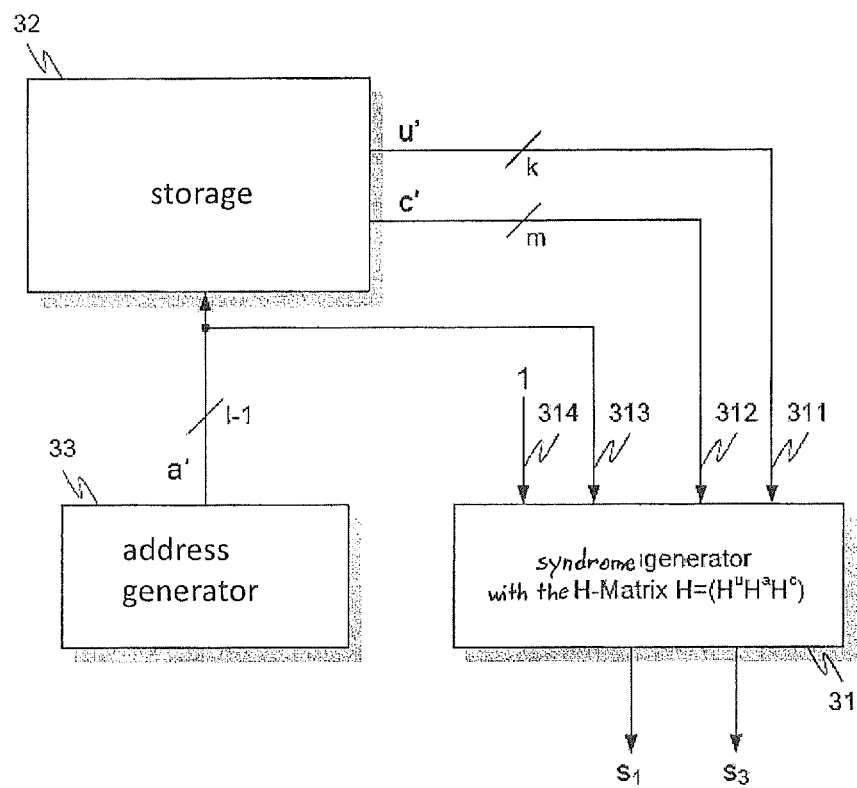
FIG. 4 is a schematic illustration of an integration of a syndrome generator.

FIG. 4 shows an circuitry for generating a syndrome $S=(s_1, s_3)$ for a 2-bit error correcting shortened BCH-code according to an embodiment. The bits u' and c' stored in the storage 32 (addressable storage) are output from the storage 32 under the address a' provided by the address generator 33. The address generated by the address generator here has the word width l–1. The data, the address and the check bits are designated in FIG. 3 by u', a', c' to indicate that the corresponding bits may be changed faulty. The data bits u' are supplied into a first input 311 of the word width k, the check bits c'' are supplied into a second input 312 and the address bits a' are supplied into a third input 313 of the word width l–1 of the syndrome generator 31. At a forth 1 bit wide input 314 the constant value 1 is applied. The syndrome generator 31 may be a combinatorial circuit determined by the check matrix. It serves for forming the syndrome $S=(s_1, s_3)$ of the considered BCH code determined as a column vector $S^T$ with respect to $$S^T=(s_1,s_3)^T=(S_1,S_2,\ldots,S_m)^T=H\cdot(u'_1,\ldots,u'_k a'_1,\ldots,c'_1,\ldots,c'_m)^T.$$

The address bits $a'_1, \ldots, a'_{l-1}$ provided by the address generator and the constant value 1 form, as described in detail later, the address bits $a'_1, \ldots, a'_l$. The check matrix H of the shortened BCH-code consists of a first (m,k) sub-matrix $H^u$, a second (m,l) sub-matrix $H^a$ and a third (m,m) sub-matrix $H^c$, wherein the first k columns of the check matrix H form the sub-matrix $H^u$, the subsequent l columns form the sub-matrix $H^a$ and the last m columns the sub-matrix $H^c$. A sub-matrix may also be called a partial matrix. The following applies here:

$$H^u = \begin{pmatrix} h^u_{1,1} & \ldots & h^u_{1,k} \\ \vdots & \vdots & \vdots \\ h^u_{m,1} & \ldots & h^u_{m,k} \end{pmatrix} = (h^u_1, \ldots, h^u_k),$$

$$H^a = \begin{pmatrix} h^a_{1,1} & \ldots & h^a_{1,l} \\ \vdots & \vdots & \vdots \\ h^a_{m,1} & \ldots & h^a_{m,l} \end{pmatrix} = (h^a_1, \ldots, h^a_l),$$

$$H^c = \begin{pmatrix} h^c_{1,1} & \ldots & h^c_{1,m} \\ \ldots & \ldots & \ldots \\ h^c_{m,1} & \ldots & h^c_{m,m} \end{pmatrix} = (h^c_1, \ldots, h^c_m)$$

For the components $S_1, S_2, \ldots, S_m$ of the syndrome $S=(S_1, \ldots, S_m)=(s_1, s_3)$ applies $$(s_1,s_3)^T=(S_1,\ldots,S_m)^T=(H^u,H^a,H^c)\cdot(u_1,\ldots,u_k,a_1,\ldots,a_l,c_1,\ldots,c_m)^T,$$

and the syndrome generator 31 realizes at its m outputs for $i=1, \ldots, m$ the Boolean functions $$S_i = h^u_{i,1} u'_1 \oplus \ldots \oplus h^u_{i,k} u'_k \oplus h^a_{i,1} a'_1 \oplus \ldots \oplus h^a_{i,l} a'_l \oplus h^c_{i,1} c'_1 \oplus \ldots \oplus h^c_{i,m} c'_m$$

Which are unambiguously determined by the elements $h^u_{i,j}$, $h^a_{i,j}$, $h^c_{i,j}$ of the sub-matrices $H^u$, $H^a$, $H^c$. A concrete implementation, e.g. by XOR-gates, is easy realizable, so that the proposed syndrome generator is easily described by the concrete form of the matrices $H^u$, $H^a$, $H^c$.

The matrices $H^u$, $H^a$, $H^c$ are determined by deleting certain columns and by reordering columns from the columns of the $(m,2^M-1)$ check matrix $H^{BCH}_{unverk}$ of an unshortened 2-bit error correcting BCH-code of length $2^M-1$ such that $m+l+k<2^m-1$. Here, the check matrix of the unshortened code is selected in its separated form, for example. The matrix $H^{BCH}_{unverk}$ then has the following form $$H^{BCH}_{unverk} = \begin{pmatrix} H_1 \\ H_3 \end{pmatrix}.$$

As the i-th column of the matrix $H_1$ is determined by $\alpha^i$, $i=0, \ldots, 2^m-2$ and $\alpha$ is a primitive element of the Galois field $GF(2^M)$, all $2^M-1$ M-digit binary vectors, expect for 0, occur as columns of $H_1$. Now a j-th component and a k-th component of the first M components of the check matrix are selected, wherein j k. The j-th component is designated as the first (selected) component (first predefined component) and the k-th component as the second (selected) component (second predefined component). As $\alpha$ is a primitive element of the Galois field $GF(2^M)$, and all $2^M-1$ possible m-digit binary vectors occur as columns of the check matrix $H_1$, there are for each of the values 01, 10 and 11 $2^{M-2}$ columns of the check matrix $H_1$ taking on the value 01, 10 and 11 in the two selected components (predefined components). Apart from that, there are $2^{M-2}-1$ columns of the matrix $H_1$ taking on the value 00 in the two selected components. All columns of the check matrix $H^{BCH}_{unverk}$ are classified into four disjoints sets $Sp^{00}$, $Sp^{10}$, $Sp^{01}$ and $Sp^{11}$, wherein $Sp^{00}$ contain all $2^{M-2}-1$ columns with the first two components 00, $Sp^{10}$ all $2^{M-2}$ with the first two components 10, $Sp^{01}$ all $2^{M-2}$ columns with the first two components 01 and $Sp^{11}$ all $2^{M-2}$ columns with the first two components 11.

According to the described concept, l linearly independent columns $h^a_1, \ldots, h^a_l$ form the matrix $H^a$ $$H^a=(h^a_1,\ldots,h^a_l),$$

wherein $h^a_j \in Sp^{00}$ applies.

As the first two components of $Sp^{00}$ are equal to 00 (first predefined component and second predefined component of each line of the first sub-matrix comprises the same second bit value), there are m−2 linearly independent columns, and $l \leq m-2$ applies. For $l=m-2$, the (l,l) matrix $\tilde{H}^a$, resulting from $H^a$, by deleting the first two lines (which say 0, ... 0) may be invertible.

In other words, a number of bits of the second group of bits of the coded bit sequence may be smaller than or equal to a number of bits of the third group of bits of the coded bit sequence minus 2.

The columns of the matrix $H^c$, $$H^c=(h^c_1,\ldots,h^c_m),$$

are selected so that they are linearly independent and that their first two components (first predefined component and second predefined component) are unequal 00 (first predefined component or second predefined component of each line of the third sub-matrix comprises the first bit value), so that for $i=1, m$ the following applies $$h^c_i \in \{Sp^{10} \cup Sp^{01} \cup Sp^{11}\}$$

The columns of the matrix $H^c$ form the set $S^{H^c}=\{h^c_1, \ldots, h^c_m\}$.

The columns of the matrix $H^u$, $$H^u=(h^u_1,\ldots,h^u_k),$$

are selected so that the first two components are unequal 00 (first predefined component or second predefined component of each line of the second sub-matrix comprises the first bit value), so that for $i=1, \ldots, k$ the following applies $$h^u_i \in \{Sp^{10} \cup Sp^{01} \cup Sp^{11}\} \setminus Sp^{H^c}.$$

In other words, the lines (in this example, the columns) of the first sub-matrix are all different from the lines of the third sub-matrix.

In addition to that, the columns of the matrices $H^u$, $H^a$, $H^c$ are determined so that the following applies:
1. The XOR-sum across the first components of all columns is equal to 0 (second bit value).
2. The XOR-sum across the second components of all columns is equal to 0 (second bit value).

3. The 1-dimensional binary vector $a_o, \ldots, a_r$ (resulting vector), determined by $$S_{AlI1} = (H^u, H^c) \cdot \underbrace{(1, \ldots, 1)}_{k+m}{}^T = H^a \cdot (a'_1, \ldots, a'_l)^T,$$

i has at least one component $a_{i=0}, i \in \{1, \ldots, 1\}$ (at least one component of the resulting vector comprises the second bit value). The vector $(1, \ldots, 1)^T$ to be multiplied with the first sub-matrix and the second sub-matrix may also be called a test vector. Alternatively, the test vector is multiplied with the whole check matrix. For this, the test vector comprises zeros for bits multiplied with components of lines of the second sub-matrix.

In other words, each component of the test vector being multiplied with the component of a line of the first sub-matrix and of the third sub-matrix comprises the first bit value and each component of the test vector being multiplied with a component of a line of the second sub-matrix comprises the second bit value.

In the following it is to be described how the matrices $H^u$, $H^a$, $H^c$ of the inventive syndrome generator may be determined practically.

From the sets $Sp^{10}$, $Sp^{01}$ and $Sp^{11}$, the sets $Spe^{10}$, $Spe^{01}$, $Spe^{11}$ are formed by deleting two random columns each and summarizing the deleted column into the sets $Sp2^{10}$, $Sp2^{01}$ and $Sp2^{11}$. Thus, the set $Sp2^{01}$ contains the two columns which were deleted from the set $Sp^{01}$ in order to determine the set $Spe^{01}$.

From the set $\{Spe^{10} \cup Spe^{01} \cup Spe^{11}\}$ m linearly independent columns are determined, designated by $h_1^c, \ldots h_m^c$ and which form the matrix (third sub-matrix)

$$H^c = (h_1^c, \ldots, h_m^c).$$

As a set, these columns are combined into the set $Sp^{H_c} = \{h_1^c, \ldots, h_m^c\}$.

From the set $Spe^{00}$ l columns are determined which are linearly independent. These columns are designated by $h_1^a, \ldots, h_l^a$ and they form the matrix (second sub-matrix)

$$H^a = (h_1^a, \ldots, h_l^a).$$

The matrix $H^u$ (first sub-matrix) consists of k columns $h_1^u, \ldots, h_k^u$, wherein $$h_i^u = \{Spe^{10} \cup Spe^{01} \cup Spe^{11}\} \setminus Sp^{H^c}$$

apply and wherein at least one column from $Spe^{10}$, at least one column from $Spe^{01}$ and at least one column from $Spe^{11}$ is contained in $\{h_1^u, \ldots, h_k^u\}$.

Thus, $H^u$ contains at least one column whose first two components are equal to 10, at least one column whose first two components are equal to 01 and at least one column whose first two components are equal to 11.

More general, the first sub-matrix comprises at least one line with the first predefined component being equal to the first bit value and the second predefined component being equal to the second bit value, at least one line with the first predefined component being equal to the second bit value and the second predefined component being equal to the first bit value and at least one line with the first predefined component and the second predefined component being equal to the first bit value.

Now, the XOR-sum of the first and the second components of the columns of $H^u$ and $H^c$ are determined. Depending on the value of this XOR-sum, the following four cases are considered:

1. If the XOR-sum is (1,1), one column of $H^u$ whose first two components are equal to (0,1), are replaced by a column of $Sp2^{10}$. Then, the XOR-sum of the first two components of the columns of $H^u$, $H^c$, after this replacement, is equal to (0,0).
2. If the XOR-sum is equal (0,1), a column of $H^u$ is replaced whose first two components are equal to (1,0), by a column from $Sp2^{11}$. Then, the XOR-sum of the first two components of the columns of $H^u$, $H^c$, after this replacement, are equal to (0,0).
3. If the XOR-sum is equal to (1,0), a column of $H^u$ whose first two components are equal to (0,1) is replaced by a column of $Sp2^{11}$. Then the XOR-sum of the first two components of the columns of $H^u$, $H^c$ after this replacement are equal to (0,0).
4. If the XOR-sum is equal to (0,0), then in this step no modification is executed.

From the matrices $H^u$ and $H^c$ obtained so far, now the vector $a'_1, \ldots, a'_l$ is determined by solving the linear equation system $$(H^u, H^c) \cdot \underbrace{(1, \ldots, 1)}_{k+m}{}^T = H^a \cdot (a'_1, \ldots, a'_l).$$

If i, $1 \leq i \leq l$ so that $a'_i = 0$, then by the check matrix $H = (H^u\ H^a\ H^c)$ determined so far, the syndrome generator is determined. At the input 314 of FIG. 4 then the value 1 for the i-th address bits $a'_i = 1$ is input as being constant. If there is no i, $1 \leq i \leq l$, so that $a'_i = 0$, the following applies $$a'_1, \ldots, a'_l = \underbrace{1, \ldots, 1}_{l}.$$

Then, in $H^u$ a column $h_j^u$ with the value of the first two components (0,1) is for example replaced by a column $h \in Sp2^{01}$ which was not part of $H^u$ before. The matrix $H^u$ modified this way is designated by $H^{u'}$. The solution of the linear equation system $$(H^{u'}, H^c) \cdot \underbrace{(1, \ldots, 1)}_{k+m}{}^T = H^a \cdot (a'_1, \ldots, a'_l)^T \quad (9)$$

then inevitably leads to a solution with $$a'_1, \ldots, a'_l \neq \underbrace{1, \ldots, 1}_{l},$$

as $$(H^{u'}, H^c) \cdot \underbrace{(1, \ldots, 1)}_{k+m}{}^T = (H^u, H^c) \cdot \underbrace{(1, \ldots, 1)}_{k+m}{}^T + h_j^u + h$$

and $h_j^u + h \neq 0$.

If $a_{1'}, \ldots, a_{l'}$ is the solution of equation (9), then after this modification of $H^u$ into $H^{u'}\ a_{i'} = 0$. As illustrated in FIG. 4, then for the i-th bit of the address the constant value 1 is input as the input 314. In other words, a bit of the second group of bits associated to the at least one component of the resulting vector comprising the second bit value comprises the first bit value.

The just determined H-matrix may then determine, for example, the XOR trees implementing the syndrome generator. In this example, the syndrome generator has, for example, the following advantageous characteristics:
1. For any address $a_1, \ldots, a_{i-1}, a_i=1, a_{i+1} \ldots, a_l$ and for $u=0, \ldots, 0$ and $c=0, \ldots, 0$ or $u=1, \ldots, 1$ and $c=1, \ldots, 1$ there is no code vector of the shortened BCH-code. The errors "All-0" and "All-1" may thus never be code vectors of the shortened BCH-code, whereby they be detected relatively easily.
   i. For example, this characteristic is achieved in particular by the value of a certain address bit constantly being equal to 1, that the columns of the matrix $H^a$ being linearly independent, that the XOR-sum of the first and the second components of the columns of the matrices $H^u$ and $H^c$ being equal to 0 and that the first and the second components of all columns of the matrix $H^a$ being equal to 0.
2. A word comprising exactly one 1 in the data bits u or the check bits c may never be a code word.
   i. As the first two components of the columns of $H^u$ and the columns of $H^c \neq 00$ and the first two components of $H^a$ being (0,0), the first two components $S_1, S_2$ of the syndrome S for a 1-bit error in the data bits or check bits are always unequal to 00, and no code word may be present. Thus, it is not possible either for a code word being corrupted by a 1-bit error in "All-0".
3. A word comprising exactly 0 in the data bits u or the check bits c may never be a code word.
   i. As the first two components of the columns of $H^u$ and the columns $H^0 \neq (0,0)$, and the XOR-sum of these components of all columns of the matrices $H^u$ and $H^c$ equal (0,0), and the first two components of $H^a$ are equal to (0,0), the first two components $S_1, S_2$ of the syndrome S are always unequal 00 and no code word may exist. Thus, it is not possible either for a code word to be corrupted by a 1-bit error in "All-1".

The concept described for determining a syndrome generator by determining its check matrix may be generalized relatively easily, if further conditions regarding columns of the check matrix are to be fulfilled. As an example of such a condition the case is regarded that in each column of the check matrix the number of ones in a subset of components (predefined plurality of components) of the column is odd. In other words, an XOR-sum of a predefined plurality of components of each line of the check matrix H is equal to a same bit value. As an example for such a subset, here the lower N components of each column are regarded belonging to the matrix $H_3$. The number of one in the lower N components thus is to be odd. If this condition is fulfilled, the parity P may be determined as an XOR-sum via the components of the sub-syndrome $s_3$, which may be done by an XOR tree with only N inputs. For the determination of the overall parity from the data bits, the address bits and the check bits, however, an XOR tree with n inputs is required, wherein n is the length of the code.

For example, for a parity bit a row may be added to the check matrix comprising only ones. In other words, a predefined same component of all lines of the check matrix may comprise a same bit value.

From the columns of the check matrix $H_{unverk}^{BCH}$ with $2^M-1$ columns, the columns of this matrix are determined fulfilling the required condition. It is here the columns comprising an odd number of ones in the N bottom components. Depending on whether the first two components of these columns are 00, 10, 01 or 11, these columns are associated to the set $Sp^{*00}, Sp^{*10}, Sp^{*01}$ and $Sp^{*11}$.

Based on these sets $Sp^{*00}, Sp^{*10}, Sp^{*01}$ and $Sp^{*11}$, just as described for the set $Sp^{00}, Sp^{10}, Sp^{01}, Sp^{11}$, check matrix $H^*=(H^{*u}, H^{*a}, H^{*c})$ and thus an syndrome generator may be determined, so that the columns of its check matrix $H^*$ comprise an additional characteristic. Here it is the characteristic that the bottom N components comprise an odd number of ones.

A concrete example is described for N=7 and the Galois field $GF(2^7)$. As a modular polynomial, the primitive polynomial $m_\alpha=z^7 z^3+1$ is used, for example, indicated in "Peterson, W., and Weldon, E.: Error Correcting Codes, 2. Auflage, MIT Press, 1972, Annex C, S. 476". The length of the unshortened code is $n=2^7-1=127$. The H-matrix of the unshortened BCH-code for the 2-bit error correction then is $$H_{BCH}^{sep} = \begin{pmatrix} \alpha^{126} & \ldots & \alpha^2 & \alpha^1 & \alpha^0 \\ \alpha^{3 \cdot 126} & \ldots & \alpha^{3 \cdot 2} & \alpha^{3 \cdot 1} & \alpha^0 \end{pmatrix}, \quad (10)$$

wherein the exponents j of $\alpha^j$ are to be regarded as modulo 127, so that for example the exponent $3 \cdot 126$ means $(3 \cdot 126)$ modulo $127=124$. The values $\alpha^1$ and $\alpha^{3i}$ in the column $\alpha^i, \alpha^{3i}$ are initially illustrated in the vector illustration as 2 seven digit binary vectors, combined into a 14-digit binary vector and regarded as a 14-digit binary number. This 14 digit binary number may be represented as a decimal number.

The following applies $(\alpha^0, \alpha^0) = (\underline{00}000010000001)_{bin}=129$ $(\alpha^1, \alpha^3) = (\underline{00}000100001000)_{bin}=264$ $(\alpha^0, \alpha^0) = (\underline{00}001001000000)_{bin}=576$ Wherein the 129 is the decimal value for the first column, 264 is the decimal value for the second column and 576 is the decimal value for the third column.

Here, the left most bit is the first bit and the right most bit is the fourteenth bit. The first bit and the second bit are underlined. These are the bits whose XOR-sum across all columns of the check matrix of the shortened BCH-code are 0,0. The columns of the unshortened H-matrix are then given by the following decimal numbers.

129, 264, 576, 1060, 2098, 4107, 8280, 1261, 2398, 4701, 9285, 3212, 6496, 12854, 8363, 1482, 2932, 5663, 11377, 7351, 14627, 13962, 10704, 6061, 12154, 6895, 13646, 11988, 6541, 13160, 8950, 399, 888, 1663, 3143, 6172, 12393, 9470, 3535, 7004, 13901, 10444, 5572, 11012, 4768, 9490, 3737, 7489, 14892, 12530, 9647, 4074, 8038, 15878, 14512, 13723, 12241, 7077, 14138, 10955, 4604, 9055, 725, 1285, 2600, 5202, 10301, 5363, 10535, 5802, 11586, 7860, 15675, 16067, 14780, 14331, 11239, 5006, 10096, 2751, 5475, 10798, 4322, 8486, 1698, 3330, 6672, 13321, 11464, 7652, 15126, 12985, 8659, 1973, 3891, 7683, 15384, 15561, 15852, 16342, 15261, 13281, 9150, 1003, 1902, 3654, 7188, 14377, 13530, 11773, 8151, 16149, 15009, 12698, 10201, 3045, 5918, 11897, 6391, 12551, 9912, 2523, 4981, 9751, 2225, 4371, 8721

Based on these 127 columns, now the sets $Sp^{00}, Sp^{10}, Sp^{01}$ and $Sp^{11}$ are formed, whose first two components in binary representation are 00, 10, 01 and 11. Thus, for example the columns 129, 264 and 567 are part of set $Sp^{00}$, as the first two components of these numbers are equal to 00 in a binary representation.

Based on the sets $Sp^{00}, Sp^{10}, Sp^{01}$ and $Sp^{11}$, the sets $Sp^{*00}, Sp^{*10}, Sp^{*01}$ and $Sp^{*11}$ are determined by the additional condition that the columns of the check matrix in their binary representation in the bits 8-14 comprise an odd number of ones. Thus, the columns 1, 2 and 3 (129, 264, 567) belong to Sp*$^{00}$, as these columns belong to Sp*$^{00}$ and in addition to that comprise, in the bits 8-14 one 1 each, i.e. an odd number of ones.

The following applies:
Sp*$^{00}$={129, 264, 576, 2098, 1261, 2398, 1482, 1663, 3535, 3737 3330, 1003, 1902, 3654 2523, 2225}
Sp*$^{10}$={8280, 9285, 12154, 11988, 8950, 10444, 11012, 9647, 12241, 10301, 11239, 10096, 8486, 9150, 11897, 9912}
Sp*$^{01}$={4107, 4701, 5663, 7351, 6541, 6172, 4768, 7077, 4604, 5202, 5363, 5802, 7860, 5006, 4322, 6672, 7652, 8151, 4981, 4371}
Sp*$^{11}$={14627, 13160, 14892, 15675, 16067, 15126, 15561, 13281, 14377, 16149, 12698, 12551}

From the set Sp*$^{10}$, the set Spe$^{10}$ is formed, by removing the two columns 9647, 12241 and combining these two columns into the set Sp2$^{10}$={9647, 12241}. The following applies.
Sp$^{e10}$={8280, 9285, 12154, 11988, 8950, 10444, 11012, 10301, 11239, 10096, 8486, 9150, 11897, 99121}.

From the set Sp*$^{01}$, the set Spe$^{01}$ is formed, by removing the two columns 7077, 4604 and combining these two columns into the set Sp2$^{01}$={7077, 4604}. The following applies:
Sp$^{e01}$={4107, 4701, 5663, 7351, 6541, 6172, 4768, 5202, 5363, 5802, 7860, 5006, 4322, 6672, 7652, 8151, 4981, 4371}.

From the set Sp*$^{11}$, the set Spe$^{11}$ is formed, by removing the two columns 16149, 13281 and combining these two columns into the set Sp2$^{11}$={16149, 13281}. The following applies:
Sp$^{e10}$={14627, 13160, 14892, 15675, 16067, 15126, 15561, 14377, 12698, 12551}, From the set Sp*$^{00}$, m−2=14−2=12 linearly independent vectors are selected forming the matrix H$^a$. The following applies:
H$^a$=(129, 264, 576, 2098, 1261, 2398, 1482, 3737, 3330, 1003, 3654, 2225).

From the set Spe$^{10}$∪Spe$^{01}$∪Spe$^{11}$ 14 linearly independent columns are determined forming the matrix H$^c$. The following applies:
H$^c$=(8280, 4107, 6672, 9285, 4768, 11012, 6172, 5202, 8486, 4371, 4322, 10444, 12551, 14377).

These columns form the set Sp$^{Hc}$, wherein
Sp$^{Hc}$={8280, 4107, 6672, 9285, 4768, 11012, 6172, 5202, 8486, 4371, 4322, 10444, 12551, 143771}.

From the set {Spe$^{10}$∪Spe$^{01}$∪Spe$^{11}$} \Sp$^{Hc}$ 16 vectors are selected forming the columns of H$^u$. These columns are determined so that they contain at least one vector from Spe$^{10}$, one vector from Spe$^{01}$ and one vector from Spe$^{11}$. Temporarily, the matrix H$^u$ results with
H$^u$=(4701, 14627, 6541, 13160, 14892, 10301, 5802, 5006, 10096, 12698, 9912, 5663, 11988, 8950, 15675, 7351).

For the XOR-sum of the first two components of the columns of H$^u$ and H$^c$ the value 10 results. To obtain a value 00 for this sum, a column with the first two components 10 is replaced by a column with the first two components 11 of Spe$^{11}$, so that the XOR-sum now is 00. Concretely, column 7351 is replaced by column 16149 of Spe$^{11}$. The matrix H$^u$ is now:
H$^u$=(4701, 14627, 6541, 13160, 14892, 10301, 5802, 5006, 10096, 12698, 9912, 5663, 11988, 8950, 15675, 16149)

From the thus determined matrices H$^u$, H$^a$, H$^c$ now the vector $a_1, \ldots, a_p$ is determined for which $$S_{All1} = (H^u, H^c) \cdot \underbrace{1, \ldots, 1}_{16+14} = H^u \cdot (a'_1, \ldots, a'_{12})$$

applies.
Due to $S_{All1}$=00010000110110 for $a'_1, \ldots, a'_{12}$ is determined as the solution of the linear equation system $S_{All1}=H^a \cdot (a'_1, \ldots, a'_{12})$ for $a'_1, \ldots, a'_{12}$=101000000011. As e.g. $a'_2$=0, the syndrome generator is determined by the just determined check matrix simply by an implementation of the corresponding linear equations with a synthesis tool, for example.

The parity signal results in the presented embodiment as an XOR operation of the components of the sub-syndrome $s_3$, i.e. by an XOR operation of the components 8 to 14 of the syndrome S. If the side condition 8 to 14 of the columns of the text matrix contain an odd number of ones is not required, the check matrix may also be supplemented by a line consisting of all ones. In a 2-bit error correcting BCH-code, then an odd number of check bits is obtained.

Figure 5:
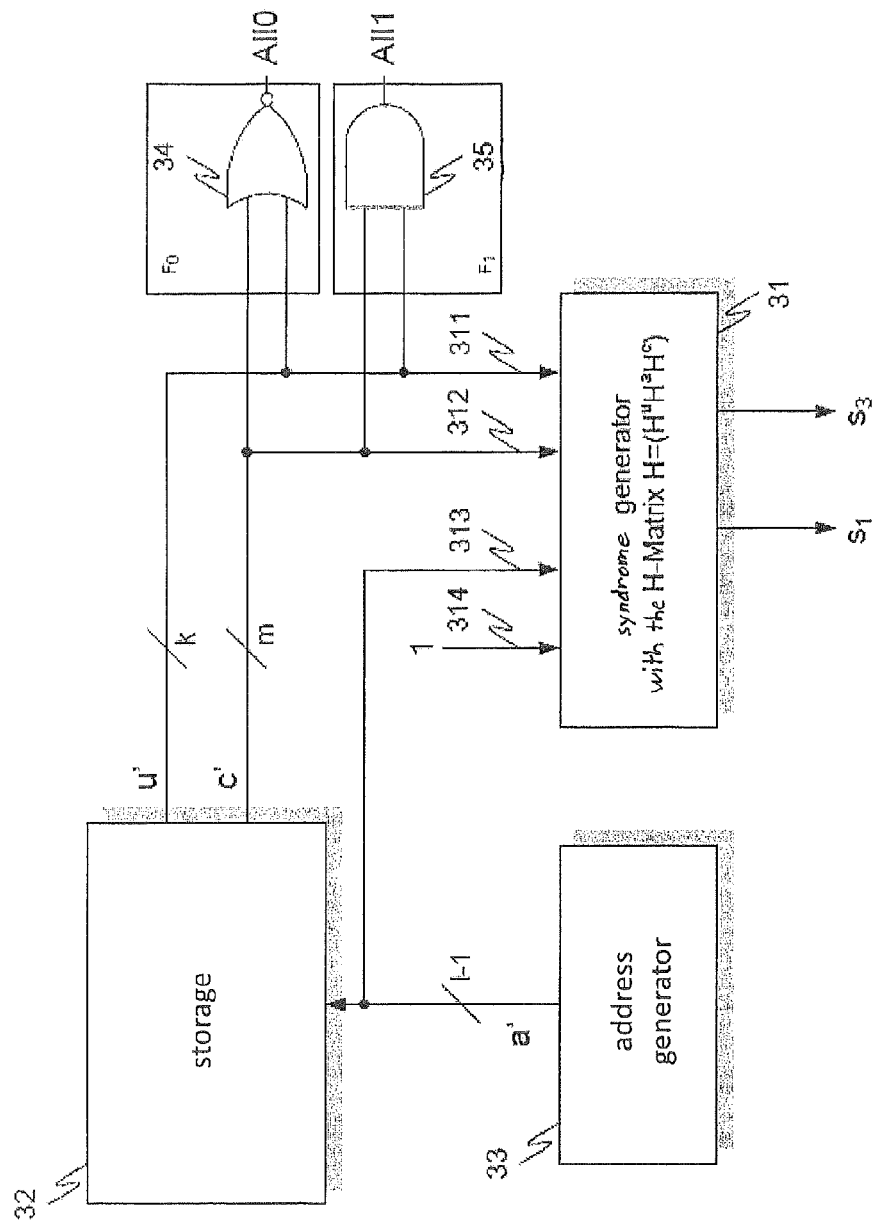
FIG. 5 is a schematic illustration of an integration of a syndrome generator including an all 0 and all 1 detection.

It is illustrated in FIG. 5, how the concept of the memory cells (of the storage) regarding the error "All-1" and "All-0" may be monitored. The partial circuits and connections designated by the same numbers in FIG. 5 and FIG. 4 have the same meaning as in FIG. 4. In addition to FIG. 4, the k bits wide output carrying the signal u (first group of bits, information bits) and the m bit wide output carrying the signal c (third group of bits, check bits) of the storage 32 are supplied both into the k+m bit wide inputs of an NOR-gate 34 and also into the k+m bit wide input of the AND gate 35. The NOR-gate 34 outputs the value All-0=1, if the memory outputs the value "All-0" under any address, while the AND-gate outputs the value All-1=1, if the memory outputs the value All-1 under any address. As neither All-1 nor All-0 is a code word for any address, an All-0 error is detected at the outputs of the NOR-gate 34 by 100%, while an All-1 error is detected at the output of the AND-gate 35 at 100%.

More general, the NOR-gate 34 and the AND-gate 35 may also be called same-bit-value-detector. A same-bit-value-detector may provide a signal indicating whether or not all bits of the first group of bits and all bits of the third group of bits of the coded bit sequence comprise a same bit value (All-0 or All-1).

Figure 6:
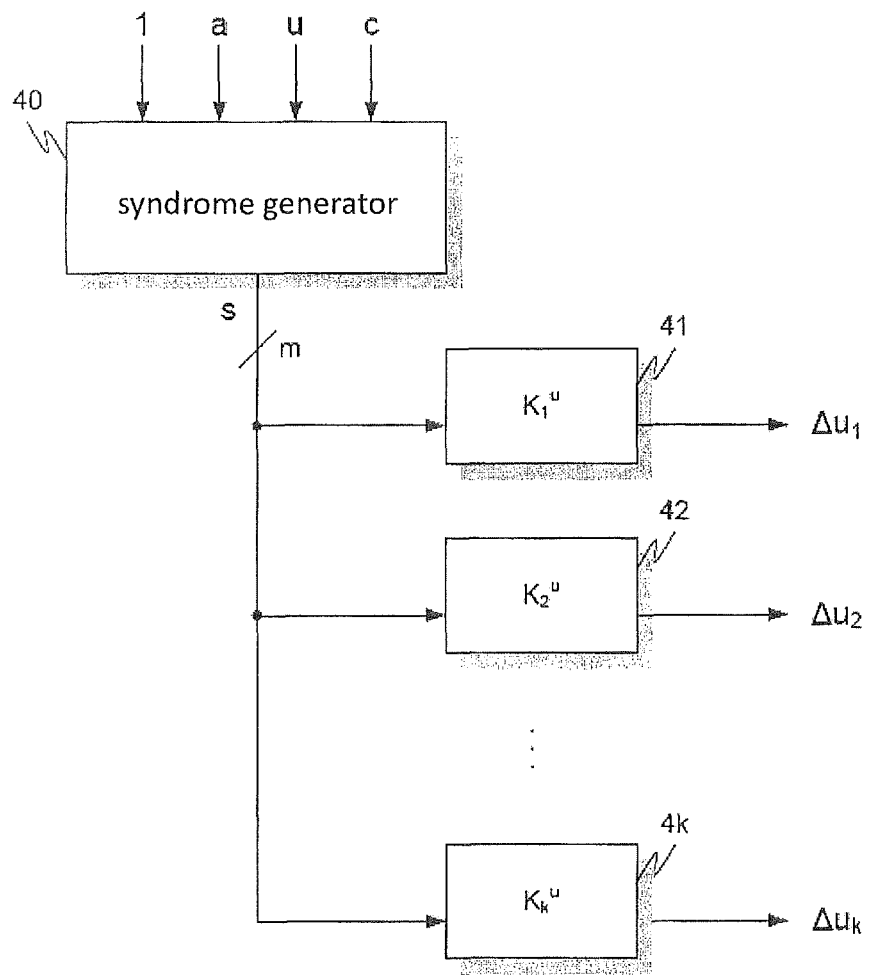
FIG. 6 is a schematic illustration of a derivation of a correction vector for data bits.

FIG. 6 shows an inventive syndrome generator 40 which outputs at its m bit wide output the value of the error syndrome S, the output being connected with the respective inputs of the circuits $K_1^u, K_2^u, \ldots, K_k^u$ 41, 42, 4k (which may be part of the bit error corrector) for determining 1-bit wide correction values $\Delta u_1, \Delta u_2, \Delta u_k$, which are outputted by these circuits at their respective outputs and XOR-ed with the data bits $u_1, u_2, \ldots u_k$, to be corrected. Functionally, for i=1, . . . , k for the correction values is $\Delta u_i$:

$$\Delta u_i = K_i^u(S) = \begin{cases} 1 & \text{for } S = h_i^u \\ 1 & \text{for } S = h_i^u + h \\ 0 & \text{else} \end{cases}$$

Here, $h_i^u$ is the i-th column of the matrix H$^u$ and h a column of the matrix H$^u$ or a column of the matrix H$^c$, wherein $h \neq h_i^u$.

Correction circuits are for example also described in "Okamo, H. and Imai, H.: A Construction Method for Decoders of BCH-Codes for Bose Chaudhuri-Hocqueng hem and Reed Salomon Codes, IEEE Trans. Comp. C 36, No 10, pp. 1165-1171, 1985".

Figure 7:
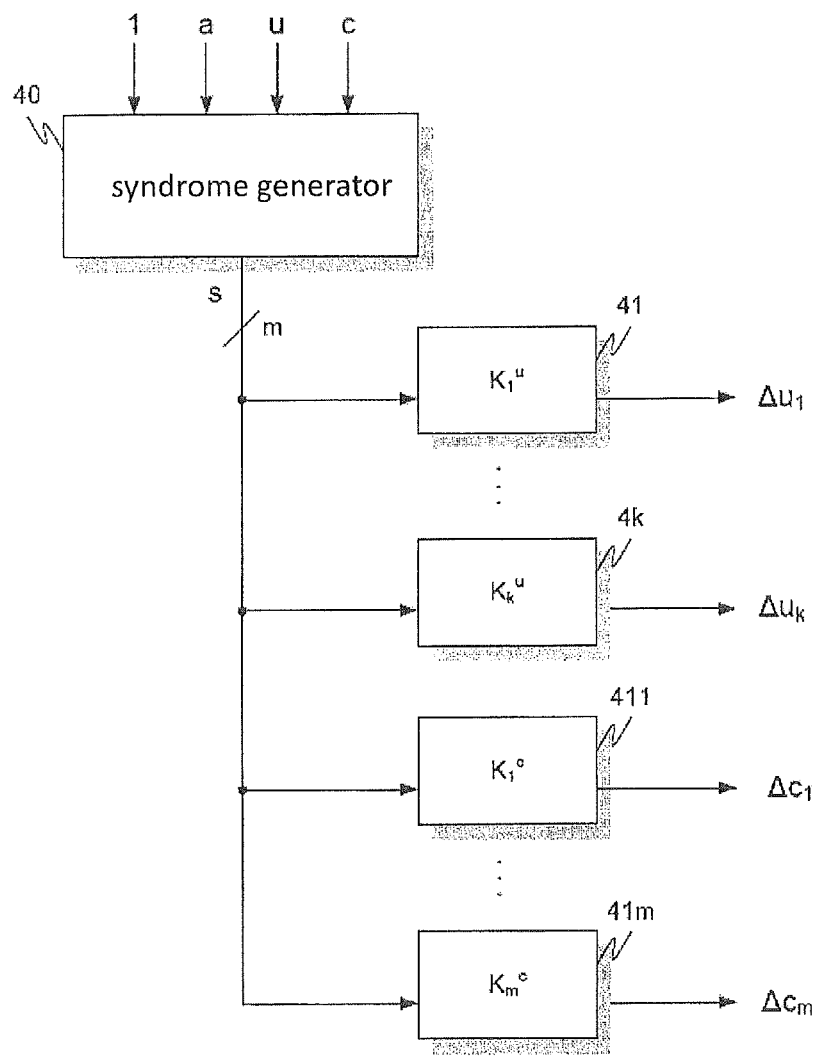
FIG. 7 is a schematic illustration of a derivation of a correction vector for data and check bits.

FIG. 7 shows an inventive syndrome generator 40, comprising, additionally to FIG. 6, further circuits $K_1^c$ 411, $K_2^c$ 412, ..., $K_m^c$ 41m (which may also be part of the bit error corrector) for determining correction values $\Delta c_1, \Delta c_2, \ldots, \Delta c_m$, which are outputted by these circuits at their outputs and that are XORed with the check bits component-by-component for correcting the check bits. The circuit parts not differing from FIG. 6 are numbered as in FIG. 6. Functionally, in the case of a 1-bit or 2-bit error, the circuit $K_j^c$ 41 with (j= 1, ..., m) realizes the function $$\Delta c_j = K_j^c(S) = \begin{cases} 1 & \text{for } S = h_j^c \\ 1 & \text{for } S = h_j^c + h \\ 0 & \text{else} \end{cases}$$

Thereby, $h_j^c$ is th j$^{th}$ column of matrix $H^c$ and h is a column of the matrix $H^u$ or the matrix $H^c$ with $h \neq h_j^c$.

Figure 8:
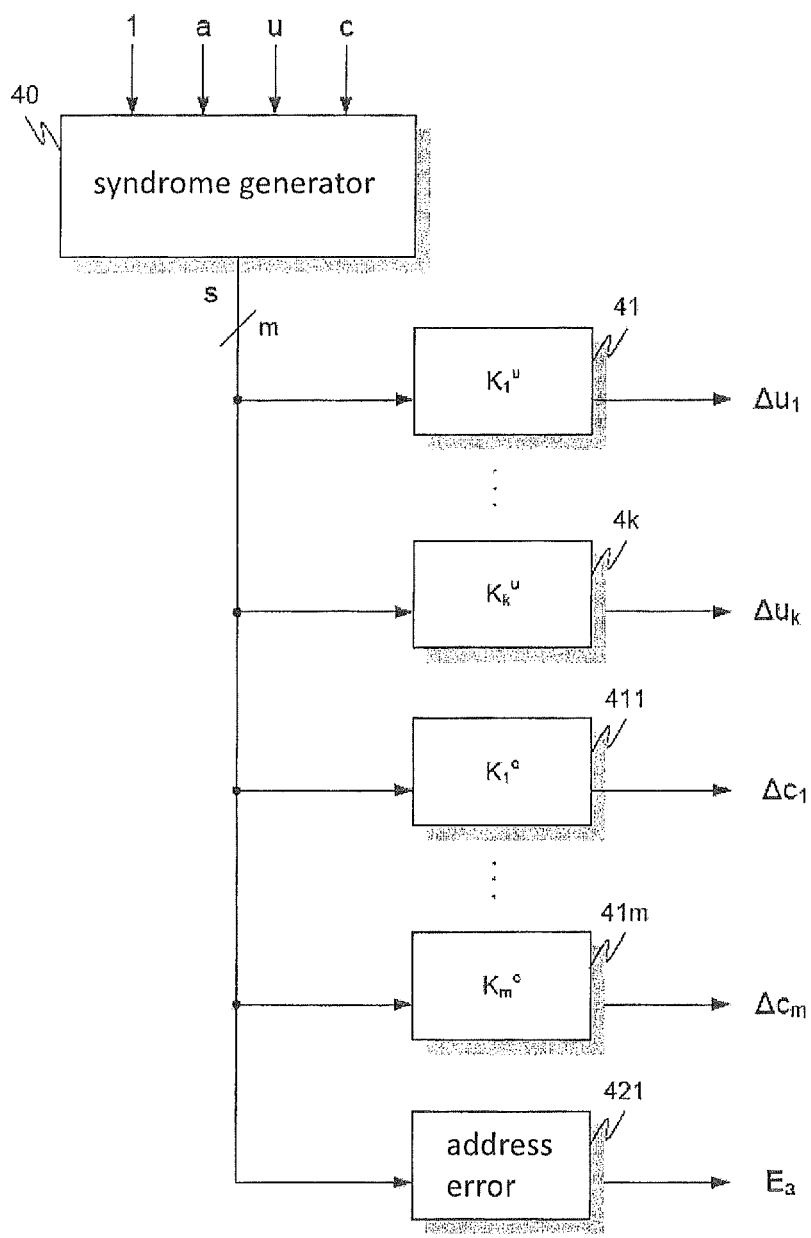
FIG. 8 is a schematic illustration of a derivation of a correction vector for data, check and address bits.

FIG. 8 shows an inventive syndrome generator 40, which comprises, in addition to FIG. 7, a further circuit for determining address errors 421 (which may also be part of the bit error corrector). This circuit outputs the value $E_a=1$ at its output when a 1-bit or 2-bit address error has occurred. Functionally, for the circuit 421 for determining address errors, the following applies $$E_a(S) = \begin{cases} 1 & \text{for } S = h^a \\ 1 & \text{for } S = h^a + h \\ 0 & \text{for } S = h^* \\ 0 & \text{for } S = h^* + h' \\ 0 & \text{for } S = 0 \\ -\text{else} \end{cases}$$

wherein $h^a$ is a column of matrix $H^a$, h a column of the matrices $H^u$, $H^a$, $H^c$ with $h \neq h^a$ and $h^*$ and $h''$ are columns of matrices $H^u$ and with $h^* \neq h''$.

Figure 9:
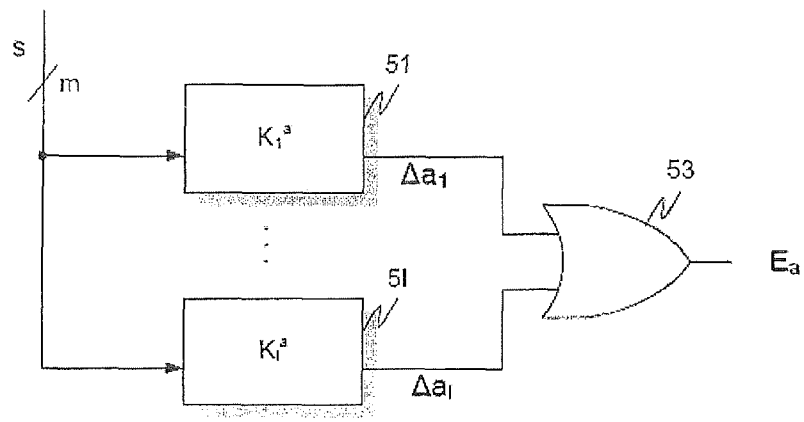
FIG. 9 is a schematic illustration of a generation of an address error signal.

FIG. 9 shows a specific embodiment of a circuit 421 of FIG. 8 for detecting address errors. The circuit of FIG. 9 consists of/circuits $K_1^a$ 51, ..., $K_l^a$ 5l for determining l correction values $\Delta a_1, \ldots, \Delta a_l$ of the possibly erroneous address bits $a'_1, \ldots, a'_l$. The outputs of circuits 51, ..., 5l carrying the correction values $\Delta a_1, \ldots \Delta a_l$ are guided into the input of an OR-gate 53 outputting the address error signal $E_a$ at its output.

For i=1, ..., l, for the correction value $\Delta a_i$ the following applies $$\Delta a_i = \begin{cases} 1 & \text{for } S = h_i^a \\ 1 & \text{for } S = h_i^a + h \\ 0 & \text{else} \end{cases}$$

Thereby, $h_i^a$ is the i$^{th}$ column of matrix $H^a$ and h is a column of matrices $H^u$, $H^a$, $H^c$ with $h \neq h_i^a$.

Figure 10:
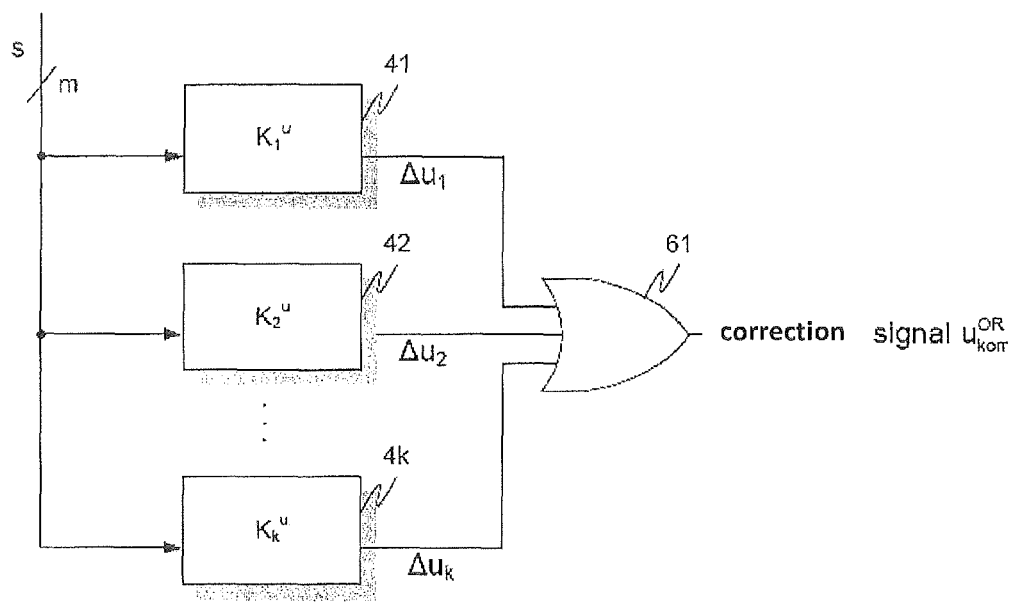
FIGS. 10, 11, 12, and 13 are schematic illustrations of a derivation of a correction signal.

In FIG. 10, it is illustrated how for i=1, ..., k, the outputs of circuits $K_i^u$, which are outputting a correction signal $\Delta u_1$, for correcting the bit $u'_i$, are connected by an OR-gate with k inputs 61 to a correction signal $u_{korr}^{OR}$. Based on signal $u_{korr}^{OR}$, it can be determined easily whether a correction has taken place at all in bits $u'_1, \ldots, u'_k$. The outputs of circuits $K_i^u$, i=1, ..., k are connected with the respective i$^{th}$ input of the OR-gate 61 outputting the signal $$u_{korr}^{OR} = \Delta u_2 v \Delta u_2 v \ldots v \Delta u_k$$

at its output.

Figure 11:
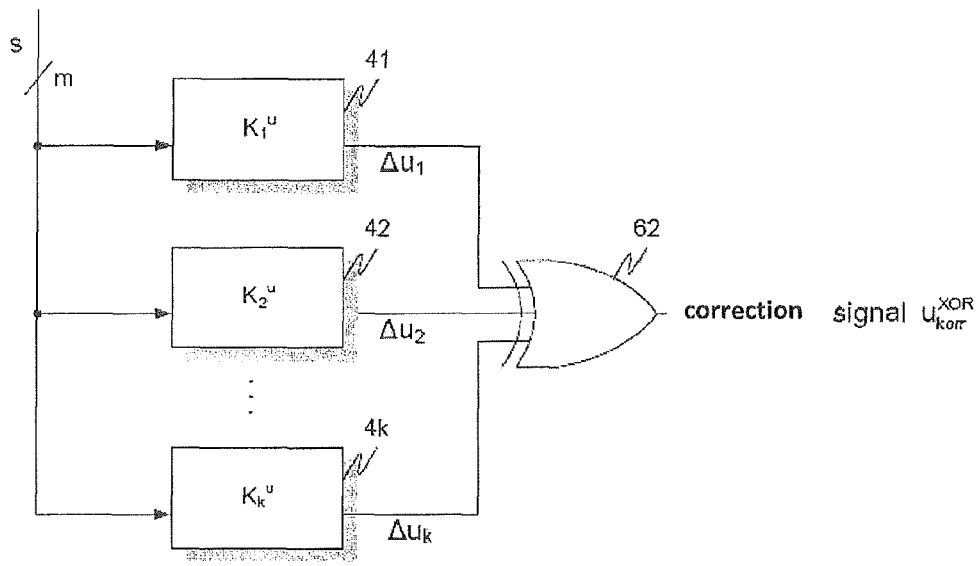

In FIG. 11, it is illustrated how for i=1, ..., k, the outputs of circuits $K_i^u$, which are outputting a correction signal $\Delta u_i$ for correcting the bit $u_i$ at its output, are connected to a correction signal $u_{korr}^{XOR}$ by an XOR-gate with k inputs 62. Based on the signal $u_{korr}^{XOR}$, it can be determined easily whether an odd number of corrections of bits $u'_1, \ldots, u'_k$ has taken place. The outputs of circuits $K_i^u$, i=1, ..., k are connected with the respective i$^{th}$ input of the XOR-gate 62 outputting the signal $$u_{korr}^{XOR} = \Delta u_1 \oplus \Delta u_2 \oplus \ldots \oplus \Delta u_k$$

at its output.

Figure 12:
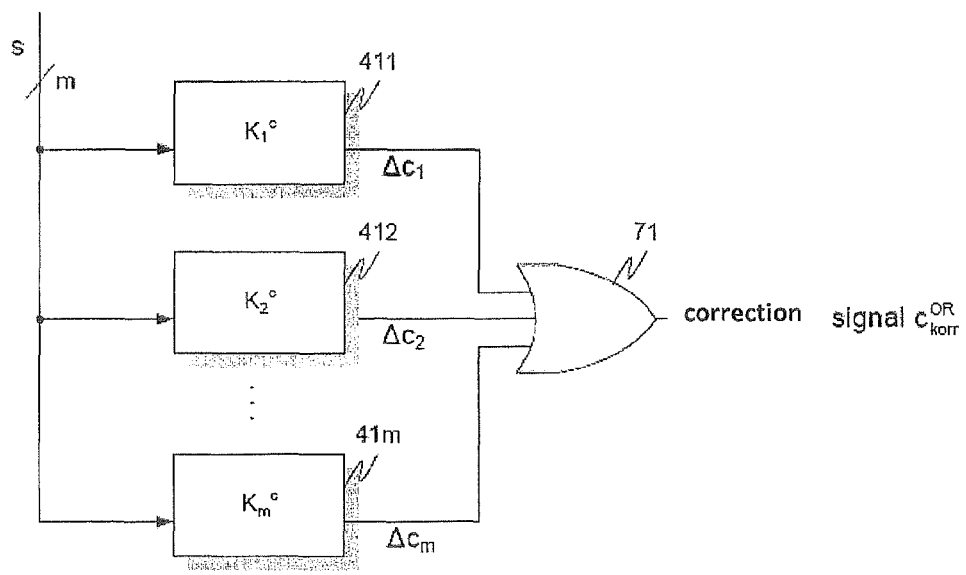

In FIG. 12, it is illustrated how for i=1, ..., m the outputs of circuits $K_i^c$, which are outputting a correction signal $\Delta c_i$ for correcting the bits $c'_i$ at their output, are connected to a correction signal $c_{korr}^{OR}$ by an OR-gate with m inputs 71. Based on the signal $c_{korr}^{OR}$ it can be determined easily whether correction has taken place at all in bits $c'_1, \ldots, c'_m$. The outputs of circuits $K_i^c$, i=1, ..., m are connected to the respective i$^{th}$ input of the OR-gate 71 outputting the signal $$c_{korr}^{OR} = \Delta c_1 v \Delta c_2 v \ldots v \Delta c_m$$

at its output.

Figure 13:
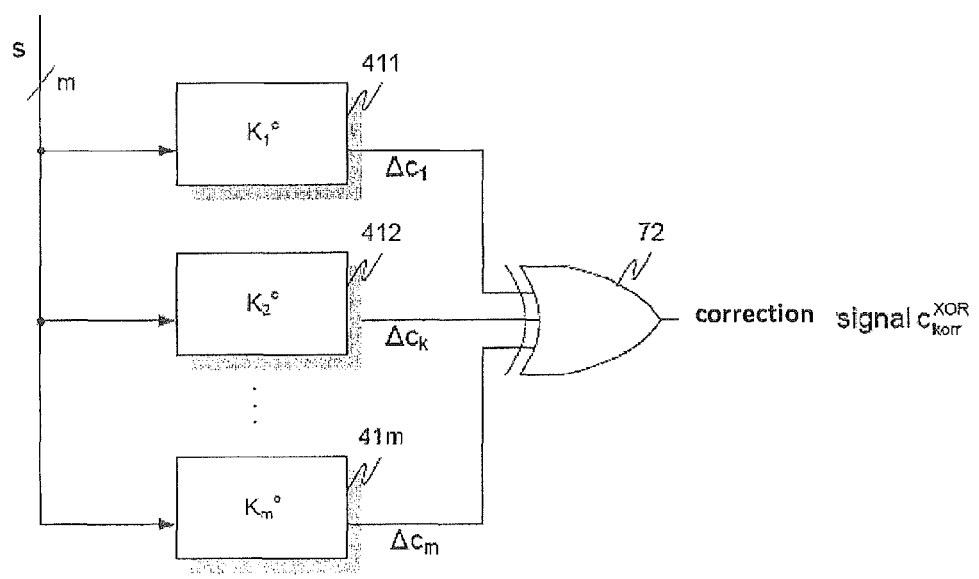
Figure 14:
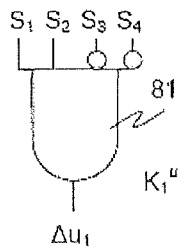
FIGS. 14a-14i are schematic illustrations of a determination of correction values.
Figure 14:
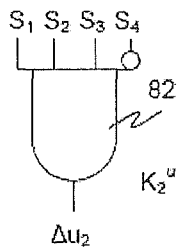
Figure 14:
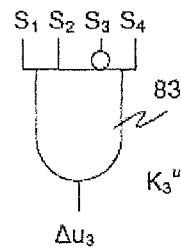
Figure 14:
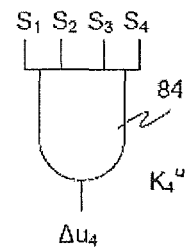
Figure 14:
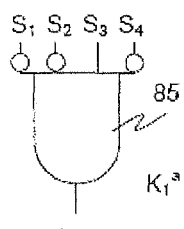
Figure 14:
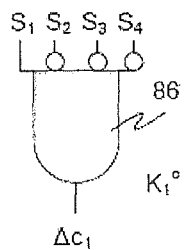
Figure 14:
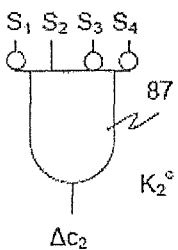
Figure 14:
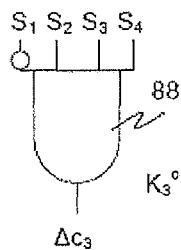
Figure 14:
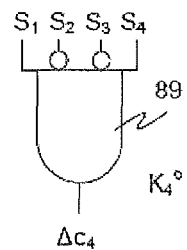

In FIG. 13, it is illustrated how for i=1, ..., m, the outputs of circuits $K_i^c$, which are outputting a correction signal $\Delta c_1$ for correcting the bit $c'_i$ at their output, are connected to a correction signal $c_{korr}^{XOR}$ by an XOR-gate with m inputs 72. Based on the signal $c_{korr}^{OR}$, it can be determined easily whether an odd number of corrections of the bits $c'_1, \ldots, c'_m$ has taken place. The outputs of circuits $K_i^c$, i=1, ..., m in are connected to the respective i$^{th}$ input of the XOR-gate 72, which outputs the signal $$c_{korr}^{XOR} = \Delta c_1 \oplus \Delta c_2 \oplus \ldots \oplus \Delta c_m$$

at its output.

Since the used BCH code is shortened, it can happen that a multi-bit error is mapped to the syndrome S(1) of a 1-bit error, wherein S(1) is equal to a column of the check matrix of the unshortened BCH code, which had been deleted when reducing the matrix. This situation can be detected easily when the signals $u_{korrek}^{OR}$ and $c_{korr}^{OR}$ are both equal 0, but the error syndrome S(1) of a 1-bit error exists.

The proposed concept is now to be described at a particularly simple example of a unshortened Hamming code having four information bits $u_1, u_2, u_3, u_4$, four check bits $c_1, \ldots, c_4$ and two address bits $a_1, a_2$. The word width k=4, m=4 and l=2 are selected to be small intentionally in order to be able to illustrate the concept as clearly as possible.

The check matrix of the unshortened Hamming code is $$H = (1_{bin}, 2_{bin}, 3_{bin}, 4_{bin}, \ldots, [15]_{bin}) = \begin{pmatrix} 1 & 0 & 1 & 0 & \ldots & 1 \\ 0 & 1 & 1 & 0 & \ldots & 1 \\ 0 & 0 & 0 & 1 & \ldots & 1 \\ 0 & 0 & 0 & 0 & \ldots & 1 \end{pmatrix}.$$

The set $Sp^{*00}$ of the columns of the check matrix whose first two components are equal to 0,0 is $$Sp^{00} = \{(0010)^T, (0001)^T, (001)^T\}.$$

The set $Sp^{01}$ of the columns of the check matrix whose first two components are equal to 0,1 is $$Sp^{01} = \{(0110)^T, (0101)^T, (0111)_T, (0100)^T\}.$$

The set $S^{10}$ of the columns of the check matrix whose first two components are equal to 1,0 is $$Sp^{10} = \{(1010)^T, (1001)^T, (1011)_T, (1000)^T\}.$$

The set $Sp^{11}$ of the columns of the check matrix whose first two components are equal to 1,1 is $$Sp^{11} = \{(1110)^T, (1101)^T, (1111)_T, (1100)^T\}.$$

As columns of the (second) sub-matrix $H^a$, two linearly independent columns are selected from $SP^{00}$, e.g. columns $(0010)^T$, $(0001)^T$.

As columns of the (third) sub-matrix $H^c$, four columns are selected from $Sp^{10}$ and $Sp^{01}$, namely columns $(0100)^T$, $(0111)^T$, $(1000)^T$, $(1001)^T$, that are linearly independent. As columns of the (first) sub-matrix $H^u$, four columns are selected from $Sp^{11}$, namely columns $(1100)^T$, $(1101)^T$, $(1110)^T$, $(1111)^T$. In the first two components, each of the values 10, 01, 11 occurs an even number of times, so that the XOR-sum of the first and second components of the matrix $$H = (H^u, H^a, H^c) = \begin{pmatrix} 1 & 1 & 1 & 1 & 0 & 0 & 1 & 0 & 0 & 1 \\ 1 & 1 & 1 & 1 & 0 & 0 & 0 & 1 & 1 & 0 \\ 0 & 1 & 0 & 1 & 1 & 0 & 0 & 0 & 1 & 0 \\ 0 & 0 & 1 & 1 & 0 & 1 & 0 & 0 & 1 & 1 \end{pmatrix}$$

is equal 00. For the syndrome $S = S_1, S_2, S_3, S_4$, results with $$S = h \cdot (u, a, c)^T$$

$$S_1 = u_1 + u_2 + u_3 + u_4 + c_1 + c_4$$

$$S_2 = u_1 u_2 + u_3 + u_4 + c_2 + c_3$$

$$S_3 = u_2 + u_4 + a_1 + c_3$$

$$S_4 = u_3 + u_4 + a_2 + c_3 + c_4$$

For the two-dimensional binary vector $a'_1, a'_2$, determined according to equation (7), the following results $$S_{All-1} = (H^u, H^c) \cdot \underbrace{(1, \ldots, 1)^T}_{8} = (0010)^T$$

and, hence, $$(0010)^T = \begin{pmatrix} 0 & 0 \\ 0 & 0 \\ 1 & 0 \\ 0 & 1 \end{pmatrix} \cdot (a'_1 \cdot a'_2)^T$$

with the solution $a'_1 = 1$ and $a'_2 = 0$.

Since $a'_2 = 0$, constantly $a_2 = 1$ is set, which results in equations $$S_1 = u_1 + u_2 + u_3 + u_4 + c_1 + c_4$$

$$S_2 = u_1 + u_2 + u_3 + u_4 + c_2 + c_3$$

$$S_3 = u_2 + u_4 + a_1 + c_3$$

$$S_4 = u_3 + u_4 + 1 + c_3 + c_4$$

which logically describes a syndrome generator according to the described concept, whose implementation may be realized, for example, with a commercially available synthesis tool.

The available addresses are here only addresses $a_1, a_2 = 0, 1$ and $a_1, a_2 = 1, 1$. The syndrome of the vector $(0000a_1 a_2 0000)$ is $S = (00a_1 1)$ and, hence, unequal 0. The syndrome of the vector $(1111a_1, a_2 1111)$ is equal $S = (00\overline{a}_1 1)$ and, hence, unequal 0. Hence, the vectors $(0000a_1, a_2 0000)$ and $(1111a_1, a_2 1111)$ are never code vectors.

Vector $0000a_1, a_2 0100$ will be considered as an example of a vector having a one in the bits stored in the memory. The associated syndrome is $S(10a_1 1)$. The same has at least 2 ones. By checking all possible 1-bit errors, it is easier to confirm that no 1-bit error can modify the vector $0000a_1, a_2 0100$ into a code word with the error syndrome $S = 0$.

A respective statement applies for all vectors having exactly one 1 in bits $u_1, u_2, u_3, u_4, c_1, c_2, c_3, c_4$. An example for the circuit for determining the correction values $K_1^u, K_2^u, K_3^u, K_4^u, K_1^a, K_1^c, K_2^c, K_3^c, K_4^c$, is shown in FIGS. 14a-14i. The value $S = (S_1, S_2, S_3, S_4)$ is inserted into the correction circuits $K_1^u 81, K_2^u 82, K_3^u 83, K_4^u 84, K_1^a 85, K_1^c 86, K_2^c 87, K_3^c 88, K_4^c 89$.

The correction circuit $K_1^u 81$ outputs the correction values $\Delta u_1 = 1$ exactly when $S = 1100$.

The correction circuit $K_2^u 82$ outputs the correction values $\Delta u_2 = 1$ exactly when $S = 1110$.

The correction circuit $K_3^u 83$ outputs the correction values $A\Delta u_3 = 1$ exactly when $S = 1101$.

The correction circuit $K_4^u 84$ outputs the correction values $\Delta u_4 = 1$ exactly when $S = 1111$.

The correction circuit $K_1^a 85$ outputs the correction values $\Delta a_1 = 1$ exactly when $S = 0010$.

The correction circuit $K_1^c 86$ outputs the correction values $\Delta c_1 = 1$ exactly when $S = 1000$.

The correction circuit $K_2^c 87$ outputs the correction values $\Delta c_2 = 1$ exactly when $S = 0100$.

The correction circuit $K_3^c 88$ outputs the correction values $\Delta c_3 = 1$ exactly when $S = 0111$.

The correction circuit $K_4^c 89$ outputs the correction values $\Delta c_4 = 1$ exactly when $S = 1001$.

The illustrated concept is also applicable when bits $u = u_1, \ldots, u_k$ consist of $K$ payload data and $q$ bits derived therefrom. Then with $k = K + q$, the following applies $$u_1, \ldots, u_k = u_1, \ldots, u_K, w_1, \ldots, w_q.$$

Bits $w_1, \ldots, w_q$ can also be referred to as inner check bits and these bits as check bits of an inner code that are determined from bits $u_1, \ldots, u_K$ by $$w_1 = f_1(u_1, \ldots, u_K),$$

$$w_2 = f_2(u_1, \ldots, u_K),$$

$$\vdots$$

$$w_q = f_q(u_1, \ldots, u_K)$$

Thereby, are $f_1, \ldots, f_q$ $K$-digit boolean functions and $k = K + q$ applies. If the boolean functions $f_1, \ldots, f_q$ are linear, then the inner code is linear. If at least one of these functions is non-linear, then the code is non-linear.

Bits $u_1, \ldots, u_k, = u_1, \ldots, u_K, w_1, \ldots, w_q$ are corrected, for example, by a shortened BCH code correcting a 2-bit error by using its check bits $c_1, \ldots, c_m$. For obtaining a particularly high probability for error detection of errors in bits $u_1, \ldots, u_k$, after the possible error correction by the BCH code, error detection in bits $u_1, \ldots, u_k$, can be performed by using the check bits of the inner code, without having to increase the number of check bits of the external code.

As an example, a non-linear code described in document DE 10 2006 005 836 or "Gössel, M., Otcheretny, V., Sogomonyan, E. and Marienfeld, D.: New Methods of Concurrent Checking, Springer Verlag 2008, p. 49-53" may be used, where, here, two internal check bits are determined by $$w_1 = u_1 u_2 \oplus u_3 u_4 \oplus \ldots u_{K-1} u_k$$

and $$w_2 = u_2 \vee u_3 \oplus u_4 \vee u_5 \oplus \ldots \oplus u_K \vee u_1$$

Any arbitrary error that does not corrupt simultaneously all bits $u_1, \ldots, u_k$ can then be detected advantageously at least with the probability ½ as, for example, described in "Gössel, M., Otcheretny, V., Sogomonyan, E. and Marienfeld, D.: New Methods of Concurrent Checking, Springer Verlag 2008, p. 49-53". It is also possible to include the address bits into the determination of the check bits of the inner code. For example, $w_1$ and $w_2$ can be determined as $$w_1 = u_1 u_2 \oplus u_3 u_4 \oplus \ldots \oplus u_{K-1} u_K \oplus a_1 a_2 \oplus \ldots \oplus a_{l-1} a_l \vee \vee$$

and $$w_2 = (u_2 \vee u_3 \oplus u_4 \vee u_5 \oplus \ldots \oplus u_K \vee a_1 \oplus a_2 \vee a_3 \oplus \ldots \oplus a_l \vee u_1) \wedge \wedge$$

It is also possible that $w_1, \ldots, w_q$ bits only depend on address bits $a_1, \ldots, a_l$ and not on bits $u_l, \ldots, u_k$. For example, bits $w_1, w_2$ can be determined by $$w_1, w_2 = (a_1 + 2a_2 + \ldots + 2^{l-1} a_l) \bmod 3$$

By using the proposed concept, an error correction circuit for 1-bit and 2-bit errors in which the address bits are integrated into error detection, wherein also the errors All-0 and All-1 may be detected as being errors in any address values, may be enabled.

Further, the described concept may enable to write, under any address any data, in particular also the value $(0, \ldots, 0)$, $(1, \ldots, 1)$ into all data bits without all memory cells being occupied by 0 (1), so that All-1 (All-0) is under no address a valid codeword in all memory cells.

Likewise, the circuitry may enable to differentiate every 1-bit-error from errors "All-1" and "All-0", which is advantageous. Thus, it may not be the case that a word read out of storage in case of a correctable 1-bit error is mixed up with an error "All-0" or in "All-1".

In the following, the very detailed example described before is explained in more general words also indicating some of the optional or additional features.

There is a circuitry for generating a m-digit syndrome $S = (S_1, \ldots, S_m)$ of a code C correcting at least a 1-bit error of a code word of the length n having a check matrix H for correcting errors of bits stored in an addressable memory. A first group $u = u_1, \ldots, u_k$ bits, a second group $a = a_1, \ldots, a_l$ of l bits and a third group $c = c_1, \ldots, c_m$ of m bits exist, and the first group of k bits and the third group of m bits are stored in addressable memory under the address a. In the error-free case, bits $c = c_1, \ldots, c_m$ are derived logically from bits $u = u_1, \ldots, u_k$ and $a = a_1, \ldots, a_l$ by XOR connections, $n = k + l + m$, wherein the circuitry has n inputs, where the bits $u_1, \ldots, u_k$, $a_1, \ldots, a_l$, $c_1, \ldots, c_m$ are applied, wherein bits $u_1, \ldots, u_k$, $c_1, \ldots, c_m$ are output from the memory when applying the address $a_1, \ldots, a_l$ and the values of the error syndrome $S = S_1, \ldots, S_m$, are determined by $$S = H \cdot (u, a, c)^T$$

and $(u, a, c)^T$ is the transposed column vector of the row vector $(u, a, c)$ and the check matrix H.

The check matrix H consists of three sub-matrices $H^u$, $H^a$, $H^c$, wherein the sub-matrix $H^u$ consists of k first columns of H, the sub-matrix $H^a$ consists of l second columns of H and the sub-matrix $H^c$ consists of the residual m columns of H, so that $$H = (H^u, H^a, H^c)$$

applies.

Further, there is a first predefined component and a second predefined component of columns of $H^u$ and $H^c$ each unequal [0,0] and such that the XOR-sum of these first predefined components of the columns of $H^u$ and the columns of $H^c$ component-by-component and the XOR-sum of the second predefined components of the columns of $H^u$ and $H^c$ component-by-component are each equal to 0.

The values of the first predefined component and the values of the second predefined component of columns of $H^a$ are each equal to [0,0].

The l columns of matrix $H^a$ are linearly independent.
The m columns of matrix $H^c$ are linearly independent.
Further, there is a bit position r, $1 \leq r \leq l$ that $$H \cdot (\underbrace{1, \ldots, 1}_{k}, \underbrace{0, \ldots, 0}_{l}, \underbrace{1, \ldots, 1}_{m}) = H^a \cdot (a'_1, \ldots, a'_{r-1}, 0, a'_{r+1}, \ldots, a'_l)$$

applies, wherein $$a'_1, \ldots, a'_{r-1}, a'_{r+1}, \ldots, a'_l \in \{0, 1\}$$

with $m + l + k \leq 2^m - 1$ and $1 \leq m - 2$.

According to an aspect, k correction circuits $K_1^u, \ldots, K_k^u$ having each m inputs and an output for generating correction values $\Delta u_1, \ldots, \Delta u_k$ for XOR connection with bits $u_1, \ldots, u_k$ read out from the memory are simultaneously connected to m outputs of the circuit mentioned before outputting the m components of the error syndrome $S = S_1, \ldots, S_m$.

Further, the correction circuits $K_1^u, \ldots, K_k^u$, when C is a 1-bit error correcting code, in the case of a 1-bit error or no error for $j = 1, \ldots, k$ realize a m-digit boolean function $K_j^u(S)$ with $$\Delta u_j = K_j^u(S) = \begin{cases} 1 & \text{for } S = h_j^u \\ 0 & \text{else} \end{cases}$$

wherein $h_j^u$ is $j^{th}$ the column of the sub-matrix $H^u$.

Alternatively or additionally, the correction circuits $K_1^u, \ldots, K_k^u$, when C is a 1-bit error and 2-bit error correcting code, in the case of a 1-bit error or a 2-bit error or no error for $j = 1, \ldots, k$ realize a m-digit boolean function $K_j^u(S)$ with $$\Delta u_j = K_j^u(S) = \begin{cases} 1 & \text{for } S = h_j^u \\ 1 & \text{for } S = h_j^u + h \\ 0 & \text{else} \end{cases}$$

wherein $h_j^u$ is the $j^{th}$ column of $H^u$ and h is an arbitrary column of $H^u$ or $H^c$.

According to another aspect, the circuitry is configured such that the logical $r^{th}$ address bit $a_r$ is set to 1 when $a_1, a_2, \ldots, a_{r-1}, \ldots, a_l = 0, \ldots, 0$ and when $$a_1, a_2, \ldots, a_{r-1}, \ldots, a_{r+1} \ldots, a_l = a'_1, a'_2, \ldots, a'_{r-1}, a'_{r+1} \ldots, a'_l$$

wherein $$a'_1, a'_2, \ldots, a'_{r-1}, a'_{r+1}, \ldots, a'_l$$

is determined such that $$H \cdot (\underbrace{1, \ldots, 1}_{k}, \underbrace{0, \ldots, 0}_{l}, \underbrace{1, \ldots, 1}_{m}) = H^a \cdot (a'_1, \ldots, a'_{r-1}, 0, a'_{r+1}, \ldots, a'_l)$$

applies.

Further, it may be configured such that $a_r$ is constantly set to 1.

According to a further aspect, a further sub-circuit $F_o$ having k+m inputs and an output for detecting the allocation All-0 of a memory cells exists, realizing an (k+m)-digit boolean function $F_0$, (u,c), for which the following applies:

$$F_0(u,c) = \vee$$

According to an aspect, a further sub-circuit $F_1$ having k+m inputs and an output for detecting the allocation All-1 of a memory cells exists, realizing an (k+m)-digit boolean function $F_1(u,c)$, for which the following applies:

$$F_1(u,c) = u_1 \wedge u_2 \wedge \ldots \wedge u_k \wedge c_1 \wedge \ldots \wedge c_m.$$

Further, the check matrix H may be supplemented by a row $$\underbrace{1, 1, \ldots, 1}_{k+m}.$$

According to another aspect, there are q components $i_1, i_2, \ldots, i_q$ of the columns of the check matrix H, so that for every column h of the check matrix H, the XOR-sum of the values of these components is each equal 1.

Additionally, a circuit component having q inputs and an output for forming the XOR-sum of the q components $s_{i_1}, \ldots, s_{i_q}$ of the error syndrome for forming the parity P, $$P = s_{i_1} \oplus \ldots \oplus s_{i_q}$$

may exist.

According to an aspect, a further sub-circuit for address error detection (same-bit-value-detection) may exist, which outputs an error signal at its output in the case of an address error.

Further, the sub-circuit for address error detection in the case that the code C is a 1-bit error detecting code may output, in the case of a 1-bit error or no error, the value $E^a(S)$ with $$E_a(S) = \begin{cases} 1 & \text{for } S = h^a \\ 0 & \text{else} \end{cases}$$

wherein $h^a$ is an arbitrary column of sub-matrix $H^a$.

Additionally, the sub-circuit for address error detection in the case that the code C is a 1-bit error and 2-bit error correcting code may output, in the case of a 1-bit error, a 2-bit error or no error, the value $E_a(S)$ with $$E_a(S) = \begin{cases} 1 & \text{for } S = h^a \\ 1 & \text{for } S = h^a + h \\ 0 & \text{else} \end{cases}$$

wherein $h^a$ is an arbitrary column of matrix $H^a$, h an arbitrary column of matrices $H^u$, $H^a$, $H^c$ with $h \neq h^a$.

According to another aspect, l additional correction circuits $K_1^a, \ldots, K_l^a$ having m inputs and one output exist, so that for j=1, ..., l the correction circuit $K_j^a$ for the case that C is a 1-bit error correcting code realizes a l-digit boolean function $K_j^a(s)$, for which $$K_j^a(S) = \begin{cases} 1 & \text{for } S = h_j^a \\ 0 & \text{else} \end{cases}$$

applies, wherein $h_a^j$ is the $j^{th}$ column of check matrix $H^a$, and H an arbitrary column of matrices $H^u$ and $H^c$ with $h' \neq h_j^a$.

According to a further aspect, l additional correction circuits $K_1^a, \ldots, K_l^a$ having m inputs and one output exists, so that for j=1, ..., l the correction circuit $K_j^a$ for the case that C is a 1-bit error and 2-bit error correcting code realizes a l-digit boolean function $K_j^a(s)$, for which $$K_j^a(S) = \begin{cases} 1 & \text{for } S = h_j^a \\ 1 & \text{for } S = h_j^a + h \\ 0 & \text{else} \end{cases}$$

applies, wherein $h_a^j$ is the $j^{th}$ column of check matrix of $H^a$ and h an arbitrary column of matrices $H^u$ and $H^c$ with $h' \neq h_j^a$.

Additionally, the l outputs of correction circuits $K_1^a, \ldots, K_l^a$ may be guided into inputs of a circuit having l inputs and one output, realizing the logical OR-connection of its inputs.

According to an aspect, m additional correction circuits $K_1^c, \ldots, K_m^c$ having m inputs and one output exist, wherein in the case that C is a 1-bit error correcting code for j=1, ..., m, the correction circuit $K_j^c$ realizes a m-digit boolean function $K_j^c(S)$, for which, in the case for 1-bit error or no error, the following applies $$\Delta c_j = K_j^c(S) = \begin{cases} 1 & \text{for } S = h_j^c \\ 0 & \text{else} \end{cases}$$

and $h^c$ is the $j^{th}$ column of sub-matrix $K^c$.

According to another aspect m additional correction circuits $K_1^c, \ldots, K_m^c$ having m inputs and one output exist, wherein, in the case that C is a 1-bit and a 2-bit error correcting code, for j=1, ..., m the correction circuit $K_j^c$ realizes a m-digit boolean function $K_j^c(S)$, for which the following applies in the case of a 1-bit error, a 2-bit error or no error:

$$\Delta c_j = K_j^c(S) = \begin{cases} 1 & \text{for } S = h_j^c \\ 1 & \text{for } S = h_j^c + h \\ 0 & \text{else} \end{cases}$$

wherein $h_j^c$ is the small $j^{th}$ column of sub-matrix $H^c$ and h an arbitrary column of sub-matrices $H^u$ or $H^c$ with $h \neq h_j^c$.

According to a further aspect, the k outputs of the correction circuits $K_1^u, \ldots, K_k^u$ are guided into the inputs of a circuit having k inputs and one output, realizing a logic OR connection of its inputs.

According to an alternative aspect, the m outputs of correction circuits $K_1^u, \ldots, K_k^u$ are guided into the inputs of a circuit having k inputs and an output realizing a logical XOR connection of its inputs.

Further, the m outputs of the correction circuits $K_1^c, \ldots, K_m^c$ may be guided into the inputs of a circuit having m inputs and one output realizing a logic OR-connection of its inputs.

Additionally, the m outputs of correction circuits $K_1^c, \ldots, K_m^c$ may be guided into the inputs of a circuit having m inputs and one output realizing a logic XOR-connection of its inputs.

According to an aspect, the $u_k, \ldots, u_{k-v}$ bits are stored in the memory are determined from the bits $u_1, \ldots, u_{k-v-1}$ stored in the memory and the address bits $a_1, \ldots, a_l$ by v+1 circuits $f_k$, $f_{k-1}, \ldots, f_{k-v}$ each having k−v+1 inputs and one output, realizing the (k−v+1)-digit boolean functions $$u_k = f_k(u_1, \ldots, u_{k-v-1}, a_1, \ldots, a_l),$$
$$\vdots$$
$$u_{k-v} = f_{k-v}(u_1, \ldots, u_{k-v-1}, a_1, \ldots, a_l)$$

Additionally, the boolean functions $f_k, \ldots, f_{k-v}$ may not depend on address bits $a_1, \ldots, a_l$.

Further, the boolean functions $f_k, \ldots, f_{k-v}$ may not depend on bits $u_1, \ldots, u_{k-v-1}$.

Additionally, at least one of the boolean functions $f_k, \ldots, f_{k-v}$ may be non-linear.

Further, v may be equal to 1.

Additionally, $f_k$ may be defined by:

$$f(u_1, \ldots, u_{k-2}, a_1, \ldots, a_l) = (u_1 \vee u_2 \oplus u_3 \vee u_4 \oplus \ldots \oplus u_{k-3} \vee u_{k-2} \oplus a_1 \vee a_2 \ldots \oplus a_{l-1} \vee a_l) \vee \vee$$

and optionally $f_{k-1}$ may be defined by:

$$f_{k-1}(u_1, \ldots, u_{k-1}, a_1, \ldots, a_l) = (u_2 \vee u_3 \oplus u_4 \vee u_5 \oplus \ldots \oplus u_{k-4}) \vee u_{k-3} \oplus u_{k-2} \wedge a_1 \oplus a_2 \wedge a_3 \oplus a_l \wedge u_1) \vee$$

According to an aspect, the check matrix $H_{unverk}$ of the not shortened BCH code has the form $$H_{unverk} = \begin{pmatrix} \alpha^{2^M-2} & \ldots & \alpha^j & \ldots & \alpha^1 & \alpha^0 \\ \alpha^{3 \cdot (2^M-2)} & \ldots & \alpha^{3 \cdot j} & \ldots & \alpha^{3 \cdot 1} & \alpha^0 \end{pmatrix}$$

and the respective exponent j is to be interpreted from $\alpha^j$ modulo $2^M-1$.

According to another aspect, the correction circuit $K_i^u$ are at least partly implemented together, the correction circuits $K_j^c$ and $K_i^u$ are at least partly implemented together and/or the correction circuits $K_j^c$, $K_i^u$ and $K_j^a$ are at least partly implemented together.

Some embodiments according to the invention relate to an apparatus for correcting at least one bit error within a coded bit sequence comprising a means for determining an error syndrome and a means for correcting bit errors. The means for determining an error syndrome may determine an error syndrome of a coded bit sequence derived by a multiplication of a check matrix with the coded bit sequence. The check matrix comprises a first sub-matrix, a second sub-matrix and a third sub-matrix, each sub-matrix comprising a plurality of lines, each line comprising a plurality of binary components. At least a first predefined component or a second predefined component of each line of the first sub-matrix comprises a first bit value. Further, the second sub-matrix comprises lines being linearly independent from each other. The first predefined component and the second predefined component of each line of the second sub-matrix comprises a same second bit value. The third sub-matrix comprises lines being linearly independent from each other and the first predefined component or the second predefined component of each line of the third sub-matrix comprises the first bit-value. Further, either an XOR-sum of the first predefined components of all lines of the sub-matrix and the third sub-matrix is equal to the second bit value and an XOR-sum of the second predefined components of all lines of the first sub-matrix and the third sub-matrix is equal to the second bit value, if the first bit value is equal to 1, or an XNOR-sum of the first predefined components of all lines of the first sub-matrix and the third sub-matrix is equal to the second bit value and an XNOR-sum of the second predefined components of all lines of the first sub-matrix and the third sub-matrix is equal to the second bit value, if the first bit value is equal to 0. Additionally, a result of a multiplication of the check matrix and the test vector is equal to a result of a multiplication of the second sub-matrix and a resulting vector, wherein at least one component of the resulting vector comprises the second bit value. The means for correcting bit errors may correct a bit error within the coded bit sequence based on the determined error syndrome of the coded bit sequence.

Figure 15:
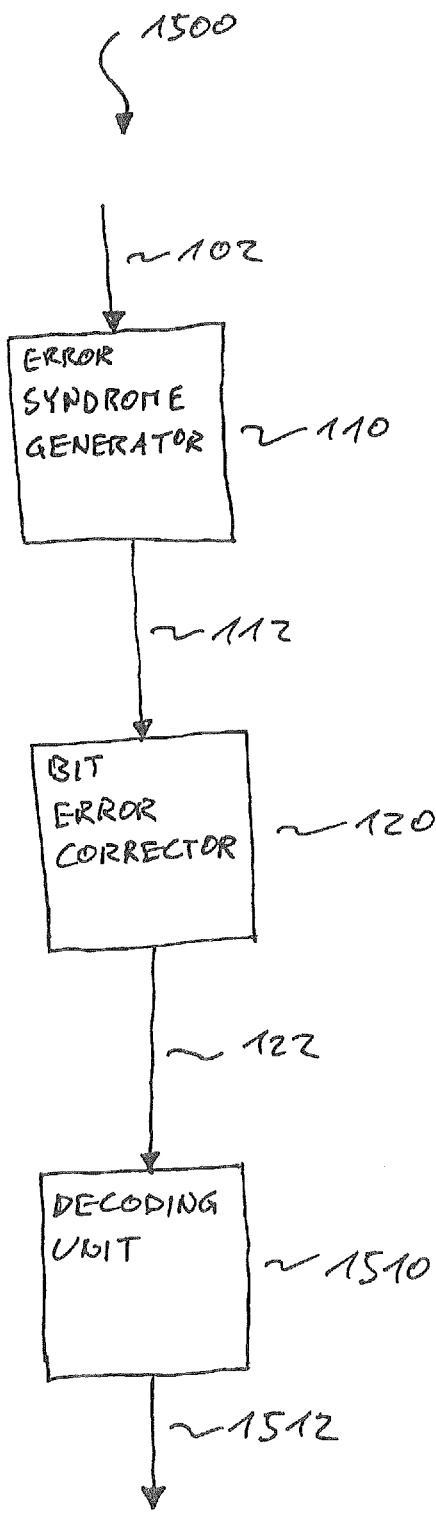
FIG. 15 is a block diagram of a decoder for decoding a faulty, coded bit sequence.

Some further embodiments according to the invention may relate to a decoder 1500 for decoding a faulty, coded bit sequence as it is shown in FIG. 15. The decoder 1500 may comprise an apparatus for correcting a bit error within a coded bit sequence according to the concept described above and a decoding unit 1510. The decoding unit 1510 may decode the corrected bit sequence 122 provided by the apparatus for correcting a bit error within a coded bit sequence to obtain a decoded bit sequence 1512.

FIG. 16 shows a flow chart of a method 1600 for correcting at least one bit error within a coded bit sequence according to an embodiment of the invention. The method 1600 comprises determining 1610 an error syndrome of a coded bit sequence derivable by a multiplication of a check matrix with the coded bit sequence. The check matrix comprises a first sub-matrix, a second sub-matrix and a third sub-matrix, each sub-matrix comprising a plurality of lines, each line comprising a plurality of binary components. Further, at least a first predefined component or a second predefined component of each line of the first sub-matrix comprises a first bit value. The second sub-matrix comprises lines being linearly independent from each other and the first predefined component and the second predefined component of each line of the second sub-matrix comprises a second bit value. The third sub-matrix comprises lines being linearly independent from each other and the first predefined component or the second predefined component of each line of the third sub-matrix comprises the first bit value. Further, either an XOR-sum of the first predefined components of all lines of the first sub-matrix and the third sub-matrix is equal to the second bit value and an XOR-sum of the second predefined components of all lines of the first sub-matrix and the third sub-matrix is equal to the second bit value, if the first bit value is equal to 1, or an XNOR-sum of the first predefined components of all lines of the first sub-matrix and the third sub-matrix is equal to the second bit value and an XNOR-sum of the second predefined components of all lines of the first sub-matrix and the third sub-matrix is equal to the second bit value, if the first bit value is equal to 0. Additionally, the result of a multiplication of the check matrix and a test vector is equal to a result of a multiplication of the second sub-matrix and a resulting vector, wherein at least one component of the resulting vector comprises the second bit value. Further, the method 1600 comprises correcting 1620 a bit error within the coded bit sequence based on the determined error syndrome of the coded bit sequence.

Additionally, the method 1600 may comprise further steps representing one or more of the optional aspects of the proposed concept described above.

Although some aspects of the described concept have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus.

Depending on certain implementation requirements, embodiments of the invention can be implemented in hardware or in software. The implementation can be performed using a digital storage medium, for example a floppy disk, a DVD, a Blue-Ray, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Some embodiments according to the invention comprise a data carrier having electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may for example be stored on a non-transitory machine readable carrier, such as a disc or other media.

Other embodiments comprise the computer program for performing one of the methods described herein, stored on a machine readable carrier.

In other words, an embodiment of the inventive method is, therefore, a computer program having a program code for performing one of the methods described herein, when the computer program runs on a computer.

A further embodiment of the inventive methods is, therefore, a non-transitory data carrier (or a digital storage medium, or a computer-readable medium) comprising, recorded thereon, the computer program for performing one of the methods described herein.

A further embodiment of the inventive method is, therefore, a data stream or a sequence of signals representing the computer program for performing one of the methods described herein. The data stream or the sequence of signals may for example be configured to be transferred via a data communication connection, for example via the Internet.

A further embodiment comprises a processing means, for example a computer, or a programmable logic device, configured to or adapted to perform one of the methods described herein.

A further embodiment comprises a computer having installed thereon the computer program for performing one of the methods described herein.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods are preferably performed by any hardware apparatus.

The above described embodiments are merely illustrative for the principles of the present invention. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

The invention claimed is:

1. Apparatus for correcting at least one bit error within a coded bit sequence, the apparatus comprising:
   an error syndrome generator configured to determine an error syndrome of a coded bit sequence, wherein the error syndrome is derived by a multiplication of a check matrix (H) with the coded bit sequence,
   wherein the check matrix (H) comprises a first sub-matrix ($H^u$), a second sub-matrix ($H^a$) and a third sub-matrix ($H^c$), wherein each sub-matrix comprises a plurality of lines, wherein each line comprises a plurality of binary components,
   wherein at least a first predefined component or a second predefined component of each line of the first sub-matrix ($H^u$) comprises a first bit value,
   wherein the second sub-matrix ($H^a$) comprises lines being linearly independent of each other, wherein the first predefined component and the second predefined component of each line of the second sub-matrix ($H^a$) comprises a same second bit value,
   wherein the third sub-matrix ($H^c$) comprises lines being linearly independent of each other, wherein the first predefined component or the second predefined component of each line of the third sub-matrix ($H^c$) comprises the first bit value,
   wherein either an XOR-sum of the first predefined components of all lines of the first sub-matrix ($H^u$) and the third sub-matrix ($H^c$) is equal to the second bit value and an XOR-sum of the second predefined components of all lines of the first sub-matrix ($H^u$) and the third sub-matrix ($H^c$) is equal to the second bit value, if the first bit value is equal to 1, or an XNOR-sum of the first predefined components of all lines of the first sub-matrix ($H^u$) and the third sub-matrix ($H^c$) is equal to the second bit value and an XNOR-sum of the second predefined components of all lines of the first sub-matrix ($H^u$) and the third sub-matrix ($H^c$) is equal to the second bit value, if the first bit value is equal to 0,
   wherein a result of a multiplication of the check matrix (H) and a test vector is equal to a result of a multiplication of the second sub-matrix and a resulting vector, wherein at least one component of the resulting vector comprises the second bit value; and
   a bit error corrector configured to correct a bit error within the coded bit sequence based on the determined error syndrome of the coded bit sequence.

2. Apparatus according to claim 1, wherein each component of the test vector being multiplied with a component of a line of the first sub-matrix ($H^u$) and of the third sub-matrix ($H^c$) comprises the first bit value, and wherein each component of the test vector being multiplied with a component of a line of the second sub-matrix ($H^a$) comprises the second bit value.

3. Apparatus according to claim 1, wherein the lines of the first sub-matrix ($H^u$) are all different from the lines of the third sub-matrix ($H^c$).

4. Apparatus according to claim 1, wherein the error syndrome of the coded bit sequence is derived based on a multiplication of the first sub-matrix ($H^u$) with a first group of bits of the coded bit sequence, a multiplication of the second sub-matrix ($H^a$) with a second group of bits of the coded bit sequence and a multiplication of the third sub-matrix ($H^c$) with a third group of bits of the coded bit sequence.

5. Apparatus according to claim 4, wherein the first group of bits represent information bits, the second group of bits represent address bits and the third group of bits represent check bits.

6. Apparatus according to claim 5, comprising an addressable storage, wherein at least the first group of bits and the third group of bits of the coded bit sequence are stored at an address of the storage unit indicated by the second group of bits.

7. Apparatus according to claim 4, wherein at least a bit of the first group of bits is dependent on at least a bit of the second group of bits.

8. Apparatus according to claim 4, wherein a bit of the second group of bits associated with the at least one component of the resulting vector comprising the second bit value comprises the first bit value.

9. Apparatus according to claim 4, further comprising a same-bit-value-detector configured to provide a signal indicating whether or not all bits of the first group of bits and all bits of the third group of bits of the coded bit sequence comprise a same bit value.

10. Apparatus according to claim 4, wherein a number of bits of the second group of bits of the coded bit sequence is smaller than or equal to a number of bits of the third group of bits of the coded bit sequence minus 2.

11. Apparatus according to claim 1, wherein an XOR-sum of a predefined plurality of components of each line of the check matrix (H) is equal to a same bit value.

12. Apparatus according to claim 1, wherein each line of the first sub-matrix ($H^u$), of the second sub-matrix ($H^a$) and of the third sub-matrix ($H^c$) is a column of the respective sub-matrix, the first predefined components of the lines of the first sub-matrix ($H^u$), of the second sub-matrix ($H^a$) and of the third sub-matrix ($H^c$) represent a row of the check matrix (H) and the second predefined component of the lines of the first sub-matrix ($H^u$), of the second sub-matrix ($H^a$) and of the third sub-matrix ($H^c$) represent another row of the check matrix (H), or wherein each line of the first sub-matrix ($H^u$), of the second sub-matrix ($H^a$) and of the third sub-matrix ($H^c$) is a row of the respective sub-matrix, the first predefined component of the lines of the first sub-matrix ($H^u$), of the second sub-matrix ($H^a$) and of the third sub-matrix ($H^c$) represent a column of the check matrix (H) and the second predefined components of the lines of the first sub-matrix ($H^u$), of the second sub-matrix ($H^a$) and of the third sub-matrix ($H^c$) represent another column of the check matrix (H).

13. Apparatus according to claim 1, wherein the error syndrome generator is configured to determine the error syndrome by multiplying the check matrix (H) with the coded bit sequence.

14. Apparatus according to claim 1, wherein the error syndrome generator and the bit error corrector are at least partly implemented together.

15. Apparatus according to claim 1, wherein a predefined same component of all lines of the check matrix (H) comprise a same bit value.

16. Apparatus according to claim 1, wherein the check matrix (H) is represented in a separated form.

17. Apparatus according to claim 1, wherein the check matrix (H) is a check matrix (H) of a shortened Hamming code, a shortened Hsiao code or a shortened BCH-code.

18. Apparatus according to claim 1, further comprising a decoding unit configured to decode the corrected bit sequence from the bit error corrector.

19. Apparatus for correcting at least one bit error within a coded bit sequence, the apparatus comprising:

a means for determining an error syndrome using a hardware error syndrome generator derived by a multiplication of a check matrix (H) with the coded bit sequence, wherein the check matrix (H) comprises a first sub-matrix ($H^u$), a second sub-matrix ($H^a$) and a third sub-matrix ($H^c$), wherein each sub-matrix comprises a plurality of lines, wherein each line comprises a plurality of binary components, wherein at least a first predefined component or a second predefined component of each line of the first sub-matrix ($H^u$) comprises a first bit value, wherein the second sub-matrix comprises lines being linearly independent of each other, wherein the first predefined component and the second predefined component of each line of the second sub-matrix comprises a same second bit value, wherein the third sub-matrix ($H^c$) comprises lines being linearly independent of each other, wherein the first predefined component or the second predefined component of each line of the third sub-matrix ($H^c$) comprises the first bit value, wherein either an XOR-sum of the first predefined components of all lines of the first sub-matrix ($H^u$) and the third sub-matrix ($H^c$) is equal to the second bit value and an XOR-sum of the second predefined components of all lines of the first sub-matrix ($H^u$) and the third sub-matrix ($H^c$) is equal to the second bit value, if the first bit value is equal to 1, or an XNOR-sum of the first predefined components of all lines of the first sub-matrix ($H^u$) and the third sub-matrix ($H^c$) is equal to the second bit value and an XNOR-sum of the second predefined components of all lines of the first sub-matrix ($H^u$) and the third sub-matrix ($H^c$) is equal to the second bit value, if the first bit value is equal to 0, wherein a result of a multiplication of the check matrix (H) and a test vector is equal to a result of a multiplication of the second sub-matrix and a resulting vector, wherein at least one component of the resulting vector comprises the second bit value; and a means for correcting bit errors within the coded bit sequence based on the determined error syndrome of the coded bit sequence.

20. Circuitry for generating a m-digit syndrome $S=(S_1 \ldots, S_m)$ of a code C correcting at least a 1-bit error of a code word of the length n having a check matrix H for correcting errors of bits stored in an addressable memory, wherein a first group $u=u_1, \ldots, u_k$ of k bits, a second group $a=a_1, \ldots, a_l$ of l bits and a third group $c=c_1, \ldots, c_m$ of m bits exist, and the first group of k bits and the third group of m bits are stored in addressable memory under the address a, wherein, in the error-free case, bits $c=c_1, \ldots, c_m$ are derived logically from bits $u=u_1, \ldots, u_k$ and $a=a_1, \ldots, a_l$ by XOR connections, n=k+l+m, wherein the circuitry has n inputs, where the bits $u_1, \ldots, u_k, a_1, \ldots, a_l, c_1, \ldots, c_m$ are applied, wherein bits $u_1, \ldots, u_k, c_1, \ldots, c_m$ are output from the memory when applying the address $a_1, \ldots, a_l$ and the values of the error syndrome $S=S_1, \ldots, S_m$ are determined by $$S = H \cdot (u,a,c)^T$$

and $(u,a,c)^T$ is the transposed column vector of the row vector (u,a,c) and the check matrix H, wherein the check matrix H consists of three sub-matrices $H^u, H^a, H^c$, wherein the sub-matrix $H^u$ consists of k first columns of H, the sub-matrix $H^a$ consists of l second columns of H and the sub-matrix $H^c$ consists of the residual m columns of H, so that $$H = (H^u, H^a, H^c)$$

applies,
  wherein there is a first predefined component and a second predefined component of columns of $H^u$ and $H^c$ each unequal [0,0] and such that the XOR-sum of these first predefined components of the columns of $H^u$ and the columns of $H^c$ component-by-component and the XOR-sum of the second predefined components of the columns of $H^u$ and $H^c$ component-by-component are each equal to 0,
  wherein the values of the first predefined component and the values of the second predefined component of columns of $H^a$ are each equal to [0,0],
  wherein the l columns of matrix $H^a$ are linearly independent,
  wherein the m columns of matrix $H^c$ are linearly independent,
  wherein there is a bit position r, $1 \leq r \leq 1$ so that $$H \cdot (\underbrace{1, \ldots, 1}_{k}, \underbrace{0, \ldots, 0}_{l}, \underbrace{1, \ldots, 1}_{m}) = H^a \cdot (a'_1, \ldots, a'_{r-1}, 0, a'_{r+1}, \ldots, a'_l)$$

applies,
  wherein
$$a'_1, \ldots, a'_{r-1}, a'_{r+1}, \ldots, a'_l \in \{0,1\}$$
with $m+l+k \leq 2^M -1$ and $1 \leq m-2$.

21. Method for correcting at least one bit error within a coded bit sequence, the method comprising:
  determining an error syndrome using a hardware error syndrome generator of a coded bit sequence derived by a multiplication of a check matrix (H) with the coded bit sequence,
  wherein the check matrix (H) comprises a first sub-matrix ($H^u$), a second sub-matrix ($H^a$) and a third sub-matrix ($H^c$), wherein each sub-matrix comprises a plurality of lines, wherein each line comprises a plurality of binary components,
  wherein at least a first predefined component or a second predefined component of each line of the first sub-matrix ($H^u$) comprises a first bit value,
  wherein the second sub-matrix comprises lines being linearly independent from each other, wherein the first predefined component and the second predefined component of each line of the second sub-matrix comprises a same second bit value,
  wherein the third sub-matrix ($H^c$) comprises lines being linearly independent from each other, wherein the first predefined component or the second predefined component of each line of the third sub-matrix ($H^c$) comprises the first bit value,
  wherein either an XOR-sum of the first predefined components of all lines of the first sub-matrix ($H^u$) and the third sub-matrix ($H^c$) is equal to the second bit value and an XOR-sum of the second predefined components of all lines of the first sub-matrix ($H^u$) and the third sub-matrix ($H^c$) is equal to the second bit value, if the first bit value is equal to 1, or an XNOR-sum of the first predefined components of all lines of the first sub-matrix ($H^u$) and the third sub-matrix ($H^c$) is equal to the second bit value and an XNOR-sum of the second predefined components of all lines of the first sub-matrix ($H^u$) and the third sub-matrix ($H^c$) is equal to the second bit value, if the first bit value is equal to 0,
  wherein a result of a multiplication of the check matrix (H) and a test vector is equal to a result of a multiplication of the second sub-matrix and a resulting vector, wherein at least one component of the resulting vector comprises the second bit value; and
  correcting a bit error using a hardware bit error corrector within the coded bit sequence based on the determined error syndrome of the coded bit sequence.

22. A computer program with program code stored on a non-transitory medium for performing a method for correcting at least one bit error within a coded bit sequence when the computer program runs on a computer or a microcontroller, the method comprising:
  determining an error syndrome using a hardware error syndrome generator of a coded bit sequence derived by a multiplication of a check matrix (H) with the coded bit sequence,
  wherein the check matrix (H) comprises a first sub-matrix ($H^u$), a second sub-matrix ($H^a$) and a third sub-matrix ($H^c$), wherein each sub-matrix comprises a plurality of lines, wherein each line comprises a plurality of binary components,
  wherein at least a first predefined component or a second predefined component of each line of the first sub-matrix ($H^u$) comprises a first bit value,
  wherein the second sub-matrix comprises lines being linearly independent from each other, wherein the first predefined component and the second predefined component of each line of the second sub-matrix comprises a same second bit value,
  wherein the third sub-matrix ($H^c$) comprises lines being linearly independent from each other, wherein the first predefined component or the second predefined component of each line of the third sub-matrix ($H^c$) comprises the first bit value,
  wherein either an XOR-sum of the first predefined components of all lines of the first sub-matrix ($H^u$) and the third sub-matrix ($H^c$) is equal to the second bit value and an XOR-sum of the second predefined components of all lines of the first sub-matrix ($H^u$) and the third sub-matrix ($H^c$) is equal to the second bit value, if the first bit value is equal to 1, or an XNOR-sum of the first predefined components of all lines of the first sub-matrix ($H^u$) and the third sub-matrix ($H^c$) is equal to the second bit value and an XNOR-sum of the second predefined components of all lines of the first sub-matrix ($H^u$) and the third sub-matrix ($H^c$) is equal to the second bit value, if the first bit value is equal to 0,
  wherein a result of a multiplication of the check matrix (H) and a test vector is equal to a result of a multiplication of the second sub-matrix and a resulting vector, wherein at least one component of the resulting vector comprises the second bit value; and
  correcting a bit error using a hardware bit error corrector within the coded bit sequence based on the determined error syndrome of the coded bit sequence.

* * * * *